(12) United States Patent
Iwai

(10) Patent No.: US 8,736,152 B2
(45) Date of Patent: May 27, 2014

(54) PIEZOELECTRIC VIBRATING PIECES AND ASSOCIATED DEVICES EXHIBITING ENHANCED ELECTRICAL FIELD

(75) Inventor: Hiroki Iwai, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 600 days.

(21) Appl. No.: 13/040,078

(22) Filed: Mar. 3, 2011

(65) Prior Publication Data
US 2011/0221311 A1   Sep. 15, 2011

(30) Foreign Application Priority Data

Mar. 15, 2010   (JP) ................................ 2010-057253
Mar. 25, 2010   (JP) ................................ 2010-069447

(51) Int. Cl.
 H03H 9/19   (2006.01)
 H03H 9/21   (2006.01)

(52) U.S. Cl.
 CPC ........................................ H03H 9/21 (2013.01)
 USPC ......... 310/370; 333/200; 331/156; 73/504.02

(58) Field of Classification Search
 CPC ............ H03H 9/19; H03H 9/21; H03H 9/215
 USPC ............................................................ 310/370
 See application file for complete search history.

(56) References Cited

U.S. PATENT DOCUMENTS

| 4,384,232 | A * | 5/1983 | Debely ........................... 310/370 |
| 6,791,243 | B2 * | 9/2004 | Kawashima ................... 310/370 |
| 6,897,743 | B2 | 5/2005 | Kawashima |
| 7,170,218 | B2 * | 1/2007 | Kawashima ................... 310/370 |
| 7,253,554 | B2 * | 8/2007 | Dalla Piazza et al. ......... 310/370 |
| 7,550,905 | B2 * | 6/2009 | Tanaya ........................... 310/370 |
| 8,217,736 | B2 * | 7/2012 | Kawashima ................... 333/187 |
| 2001/0015102 | A1 * | 8/2001 | Janiaud et al. ............. 73/514.01 |
| 2009/0051252 | A1 | 2/2009 | Shirai |
| 2010/0156237 | A1 * | 6/2010 | Ichikawa et al. ............... 310/312 |

(Continued)

FOREIGN PATENT DOCUMENTS

JP     56-065517 A    6/1981
JP     2003-204240    7/2003

(Continued)

OTHER PUBLICATIONS

Office Action for related Japanese Patent Application No. 2010-069447, 5 pages, dated Apr. 10, 2012.

*Primary Examiner* — J. San Martin

(74) *Attorney, Agent, or Firm* — Klarquist Sparkman, LLP

(57) ABSTRACT

An exemplary tuning-fork type piezoelectric vibrating piece has a rectangular base having upper and lower main surfaces and a pair of vibrating arms extending longitudinally from the base. The vibrating arms also have the upper and lower main surfaces. Each main surface of each vibrating arm defines a respective vibrating-arm groove extending longitudinally into the base. Each main surface of the base has at least one respective step-side surface situated outboard, in an X-axis direction, of each vibrating-arm groove. Each step-side surface is parallel with the respective vibrating-arm groove. A first electrode is situated on the vibrating-arm grooves of the first vibrating arm and on the at least one respective step-side surface on each main surface. A second electrode is situated on the vibrating-arm grooves of the second vibrating arm and on the at least one respective step-side surface on each main surface. The first and second electrodes are energized with different electrical polarities.

19 Claims, 18 Drawing Sheets

(56) References Cited

U.S. PATENT DOCUMENTS

2013/0076211 A1* 3/2013 Arimatsu .................... 310/370
2013/0082792 A1* 4/2013 Arimatsu .................... 331/158

FOREIGN PATENT DOCUMENTS

| | | |
|---|---|---|
| JP | 2003-273703 | 9/2003 |
| JP | 2004-260718 | 9/2004 |
| JP | 2006217603 A * | 8/2006 |
| JP | 2006-238001 | 9/2006 |
| JP | 2007-096900 | 4/2007 |
| JP | 2009-207022 | 9/2009 |
| JP | 2010-004456 | 1/2010 |
| JP | 2011151780 A * | 8/2011 |
| WO | WO 2007/004348 A1 | 1/2007 |

* cited by examiner

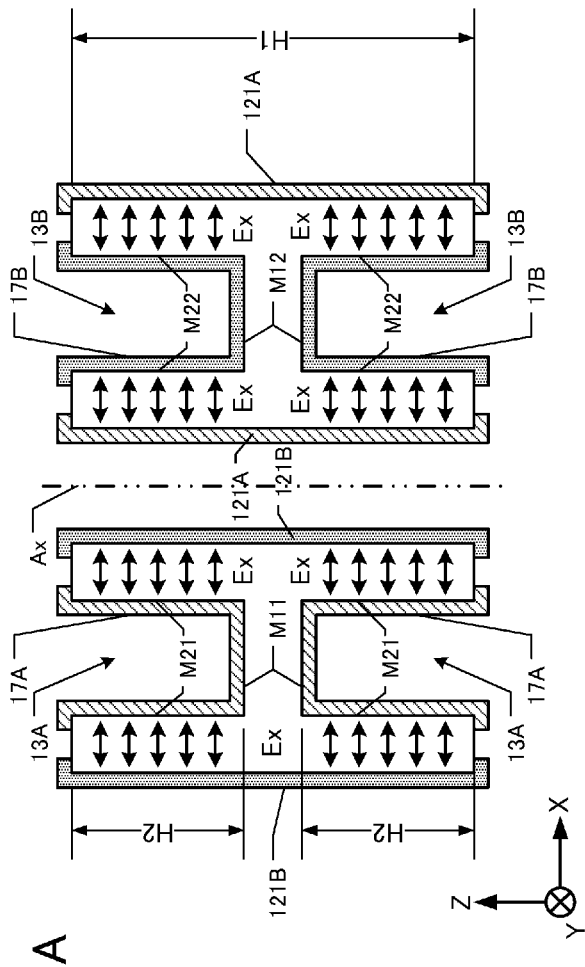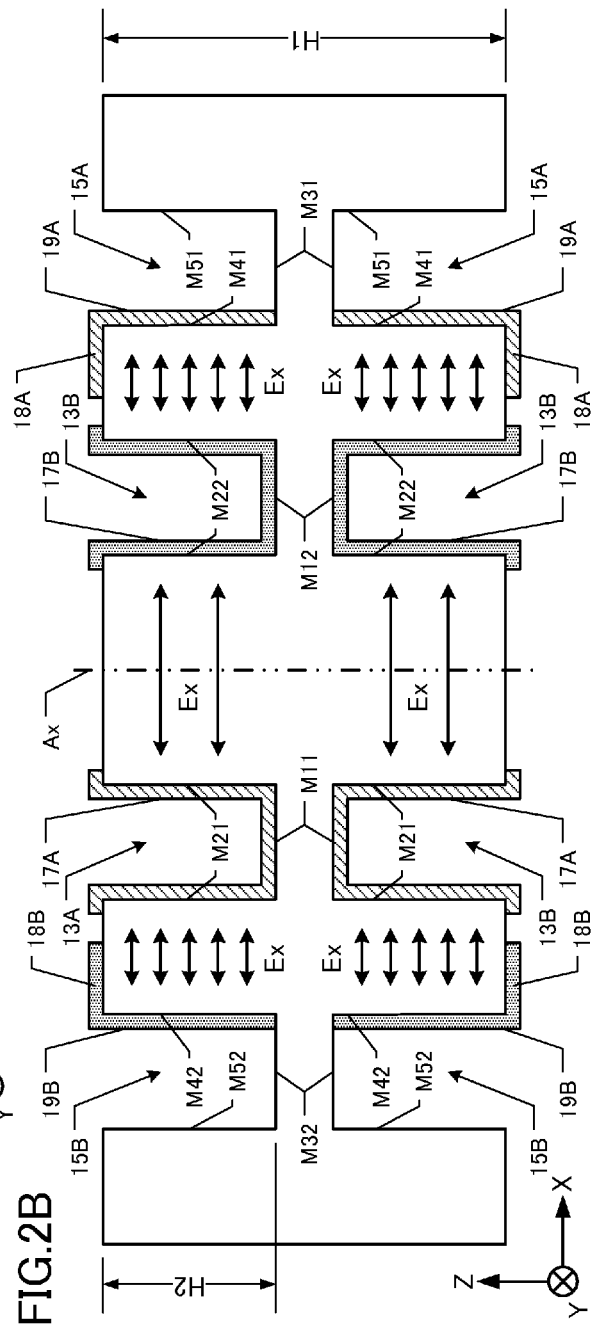
FIG.2A
FIG.2B

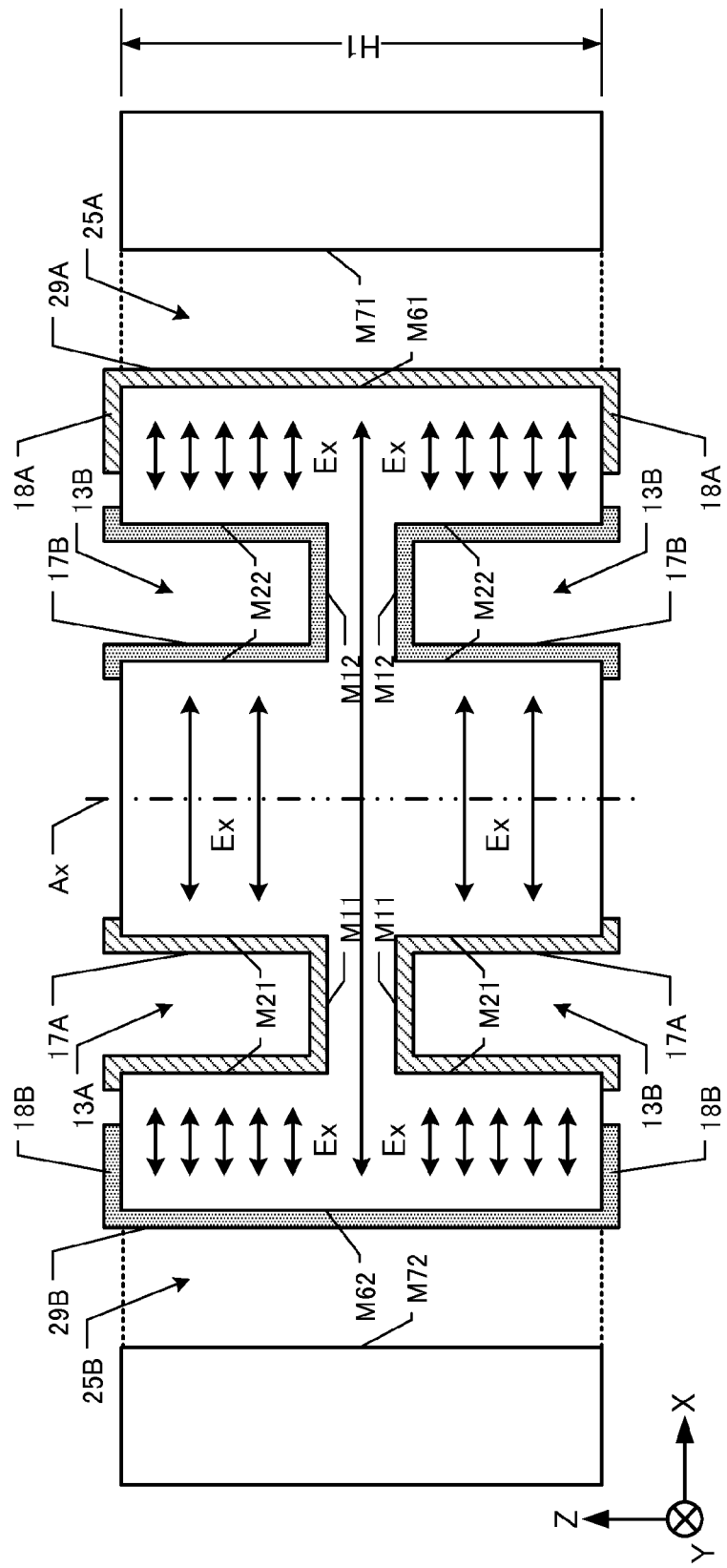

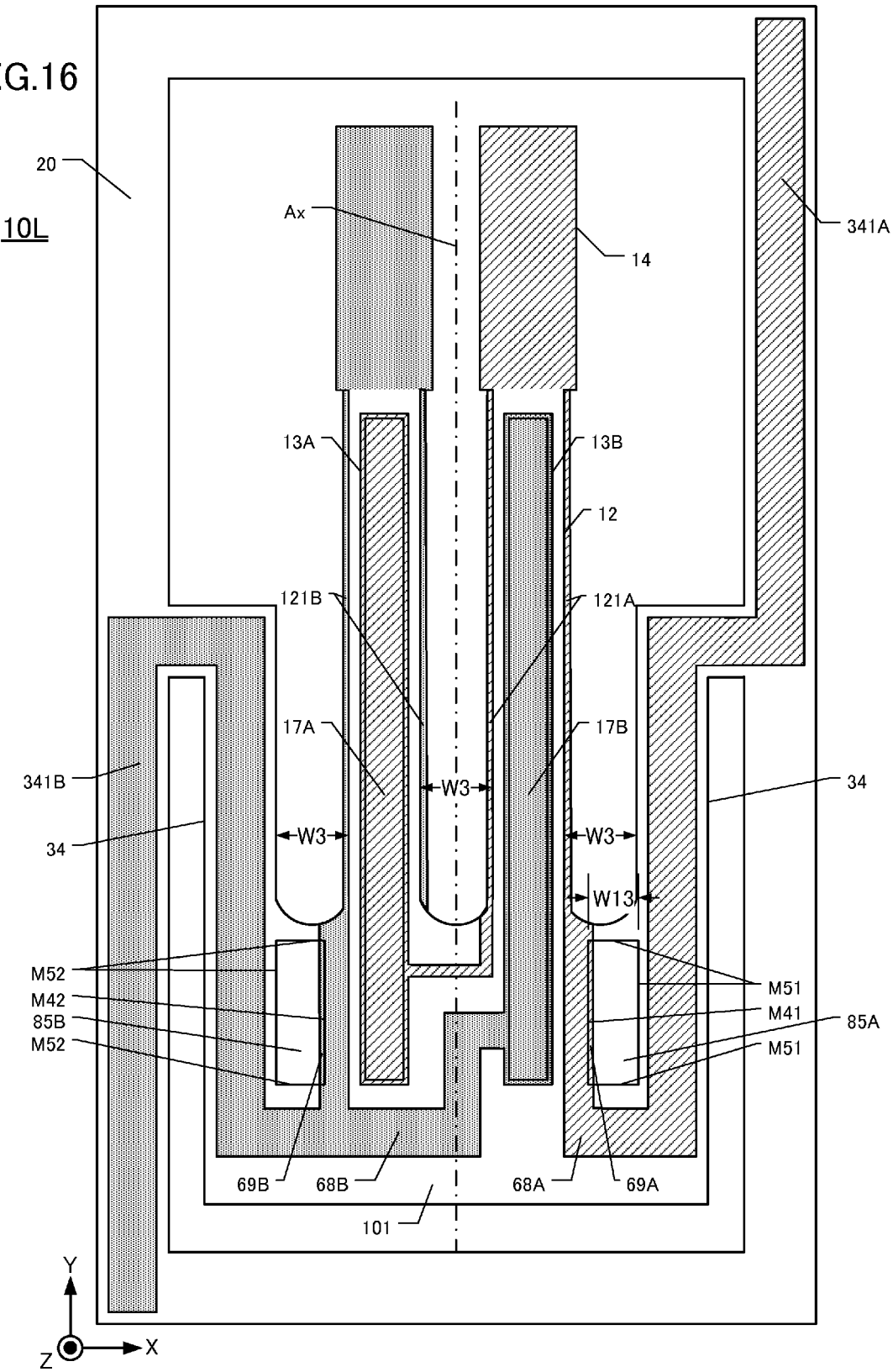

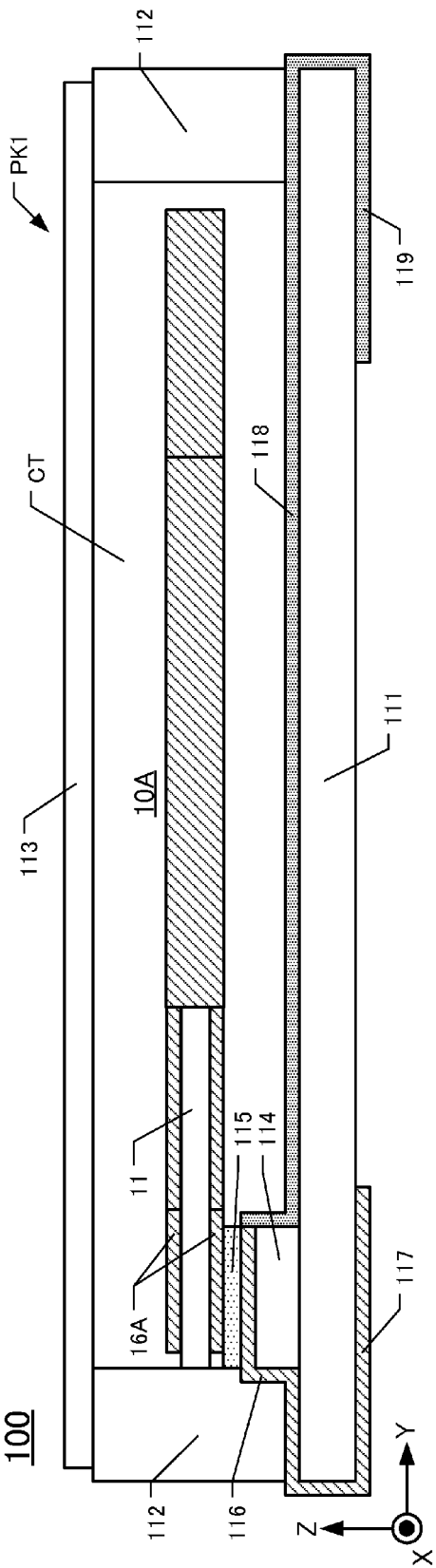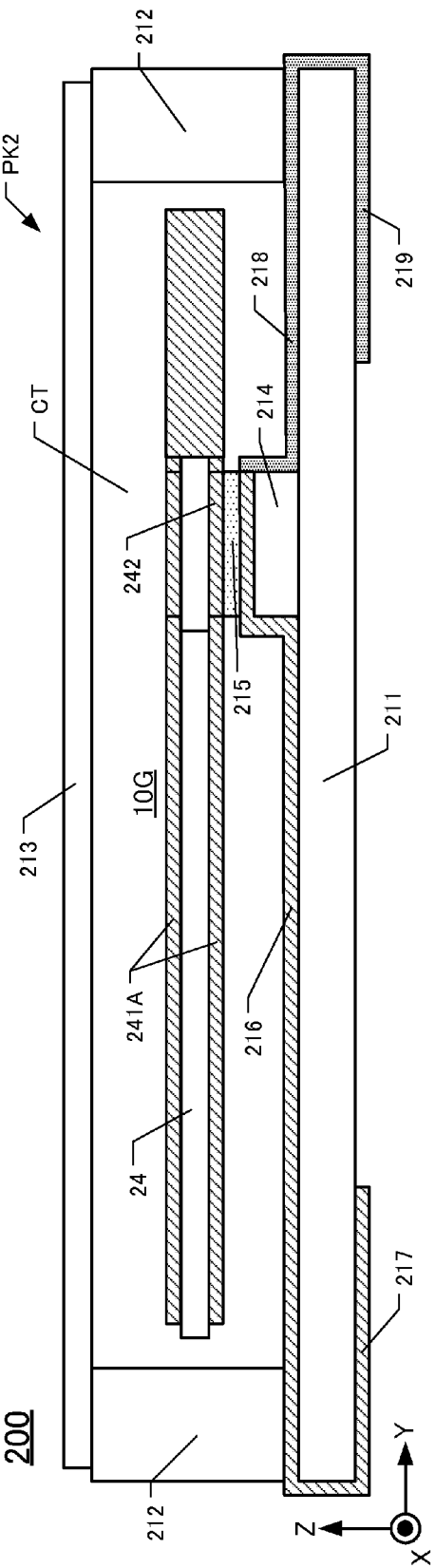

PIEZOELECTRIC VIBRATING PIECES AND ASSOCIATED DEVICES EXHIBITING ENHANCED ELECTRICAL FIELD

CROSS-REFERENCE TO RELATED APPLICATIONS

This application claims priority to and the benefit of Japan Patent Application No. 2010-057253, filed on Mar. 15, 2010, and Japan Patent Application No. 2010-069447, filed on Mar. 25, 2010, in the Japan Patent Office, the disclosures of which are incorporated herein by reference in their respective entireties.

FIELD

This disclosure relates to, inter alia, tuning-fork type piezoelectric vibrating pieces made of a crystal material and a piezoelectric crystal material, such as lithium niobate. The disclosure also pertains to piezoelectric devices including such pieces.

DESCRIPTION OF THE RELATED ART

Tuning-fork type piezoelectric vibrating pieces having a base and a pair of vibrating arms extending from the base are known. The smaller the tuning-fork type piezoelectric vibrating piece, the smaller the electrical field component generated by the vibrating arms, and the larger the equivalent series resistance. Thus, a small tuning-fork type piezoelectric vibrating piece typically has a small Q value (a parameter indicating stability of vibration). I.e., as the tuning-fork type piezoelectric vibrating piece is reduced in size, the produced vibrations become less stable.

A tuning-fork type piezoelectric vibrating piece as disclosed in U.S. Pat. No. 6,897,743 has been proposed for providing miniaturized tuning-fork type piezoelectric vibrating pieces exhibiting highly stable vibration. The tuning-fork type piezoelectric vibrating piece disclosed in the '743 patent includes respective grooves on each vibrating arm. Specifically, a respective groove is formed on each main surface of each arm, and a respective excitation electrode is formed on each groove. The grooves extend on the first and second main surfaces to the base. In addition, on each main surface a pair of grooves having a different polarity extend between the vibrating-arm grooves to the base. As a result, the tuning-fork type piezoelectric vibrating piece disclosed in the '743 reference produces a larger electrical field.

However, current industry requires greater miniaturization and higher stability of the tuning-fork type piezoelectric vibrating piece. As a result, it is increasingly difficult to form a pair of grooves in the space between the vibrating-arm grooves of the tuning-fork type piezoelectric vibrating piece disclosed in the '743 reference, and it is also increasingly difficult to form excitation electrodes between the vibrating arms. Also, since four grooves are formed between the vibrating arms, the strength of the base is reduced, which may adversely affect stability and/or reliability of vibration.

SUMMARY

The present invention addresses the foregoing issues and provides, inter alia, piezoelectric vibrating pieces and piezoelectric devices comprising same, in which the electric field is not reduced despite miniaturization and that allow volume manufacturing and stability of vibration.

According to a first aspect, piezoelectric vibrating pieces are provided. An example embodiment of such a piece comprises a base that is substantially rectangularly shaped. The piece has an upper main surface and a lower main surface. First and second vibrating arms, each having the upper and lower main surfaces, extend in the Y-axis direction from the base. Both main surfaces of each vibrating arm define respective vibrating-arm grooves that extend (in the Y-axis direction) from the vibrating arms into the base. Also, on each of the upper and lower main surfaces of the base, respective "steps" are defined. Each step is situated outboard (in the X-axis direction) of the respective vibrating-arm groove, extends parallel to the respective vibrating-arm groove, and extends depthwise into the thickness dimension of the base. Thus, each step defines at least one "step-side surface." A first electrode is situated on the vibrating-arm grooves of one vibrating arm and extends onto the respective step-side surface of the adjacent step. Similarly, a second electrode is situated on the vibrating-arm grooves of the other vibrating arm and extends onto the respective step-side surface of the adjacent step. The electrodes are energized with different respective polarities.

According to another embodiment, the piezoelectric vibrating piece comprises a base, which is substantially rectangular in shape. The vibrating piece has a first main surface and a second main surface. Extending from the base in the Y-axis direction are first and second vibrating arms each having the upper and lower main surfaces. Both main surfaces of each vibrating arm define respective vibrating-arm grooves that extend (in the Y-axis direction) from the vibrating arms into the base. Associated with each vibrating arm is a respective supporting arm situated outboard of the respective vibrating arm. Each supporting arm extends, from the respective X-direction edge of the base, in the Y-axis direction. Also, on each of the upper and lower main surfaces of the base, respective "steps" are defined. Each step is situated outboard (in the X-axis direction) of the respective vibrating-arm groove and inboard (in the X-axis direction) of the respective supporting arm. Thus, each step defines at least one step-side surface. A first electrode is situated on the vibrating-arm grooves of one vibrating arm and extends onto the respective step-side surface of the adjacent step. Similarly, a second electrode is situated on the vibrating-arm grooves of the other vibrating arm and extends onto the respective step-side surface of the adjacent step. The electrodes are energized with different respective polarities.

A third embodiment of a piezoelectric vibrating piece further comprises a frame that surrounds (in the XY plane) the base and vibrating arms. The embodiment includes supporting arms (as in the embodiment summarized above) that are connected to the frame and support the base and the vibrating arms.

An exemplary step is a through-hole extending depthwise completely through the base from one main surface to the other main surface. Such a step has multiple step-side surfaces on which at least one is situated a portion of the respective electrode. Steps configured as respective through-holes can be formed at the time the respective profiles of the base and vibrating arms are formed.

Another exemplary step is a base-groove that, unlike a through-hole step, does not fully extend through the thickness dimension of the base. Such a step has multiple step-side surfaces on which at least one is situated a portion of the respective electrode. Steps configured as respective base-grooves can be formed at the time the vibrating-arm grooves are formed.

Another exemplary step is a notch situated on a respective X-side edge of the base. Such a step has multiple step-side surfaces on which at least one is situated a portion of the respective electrode. Steps configured as respective notches can be formed at the time the vibrating-arm grooves are formed.

Another aspect of the invention is directed to piezoelectric vibrating devices including a piezoelectric vibrating piece enclosed within a respective "package." The package defines a cavity for accommodating the piezoelectric vibrating piece according to any of the various embodiments described herein. The package can comprise a lid and a package base, between which is sandwiched a frame surrounding the base and vibrating arms of the vibrating piece.

The various embodiments of tuning-fork type piezoelectric vibrating pieces each produce an electric field that does not decrease even if the devices are miniaturized. Also, the various embodiments are amenable to mass production and exhibit highly stable vibrations.

BRIEF DESCRIPTION OF THE DRAWINGS

FIG. 2A is a cross-sectional view along the line A-A of FIG. 1.

FIG. 2B is a cross-sectional view of the first embodiment along the line B-B in FIG. 1.

FIG. 3 is a cross-sectional view of the second embodiment along the line B-B in FIG. 1.

FIG. 16 is a plan view of an eleventh embodiment of a tuning-fork type piezoelectric vibrating piece.

FIG. 17A is a side view of a piezoelectric vibrating device including the first embodiment of a tuning-fork type piezoelectric vibrating piece.

FIG. 17B is a side view of a piezoelectric vibrating device including the seventh embodiment of a tuning-fork type piezoelectric vibrating piece.

DETAILED DESCRIPTION

The various embodiments are described below with reference to the accompanying figures. In the respective embodiments, the direction in which the vibrating arms extend is the Y-axis direction, the width direction of the vibrating arm is the X-axis direction, and the direction normal to the X-axis and Y-axis directions is the Z-axis direction.

First Embodiment of Tuning-Fork Type Piezoelectric Vibrating Piece

Figure 1:
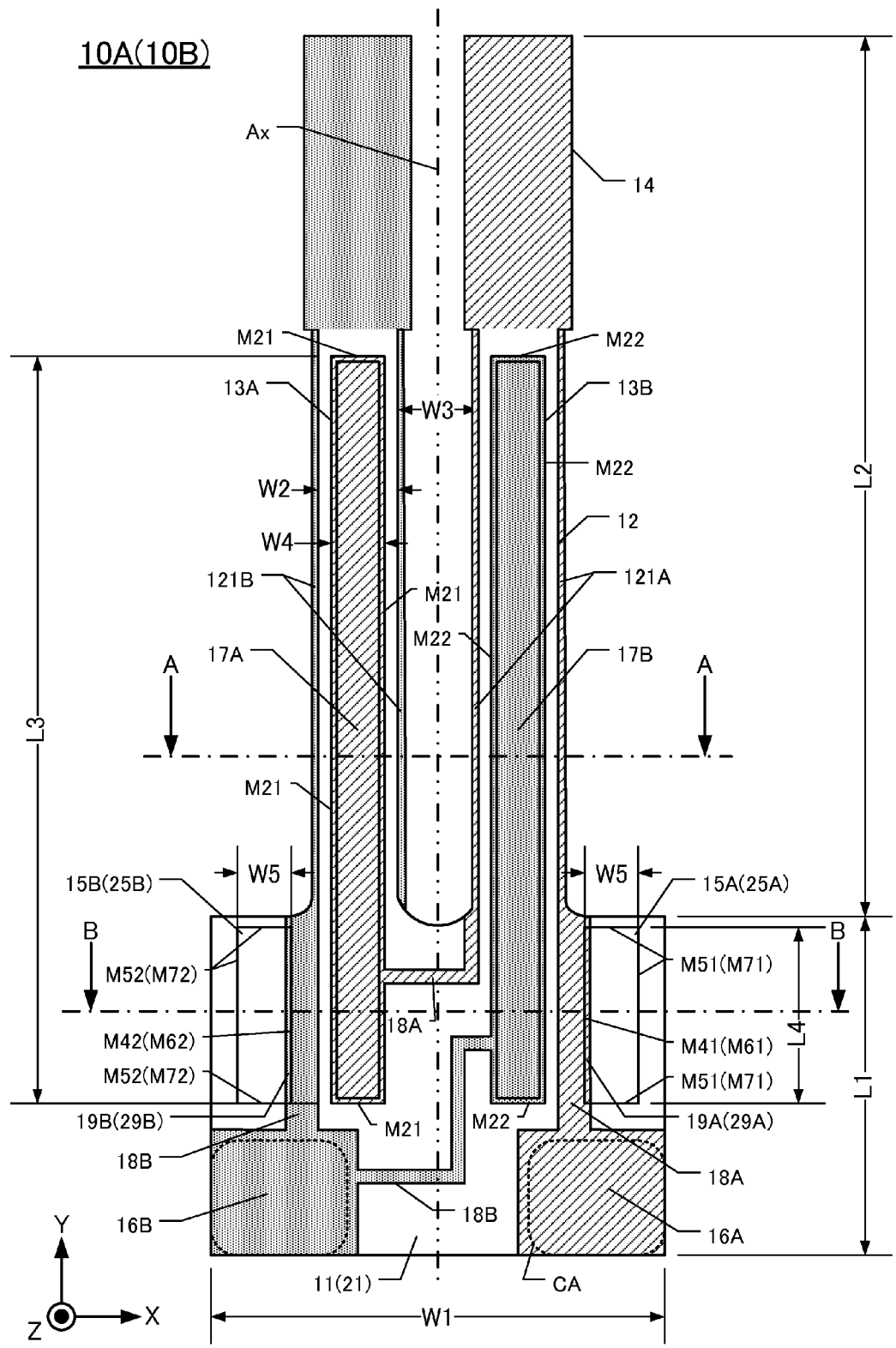
FIG. 1 is a plan view of a first embodiment of a tuning-fork type piezoelectric vibrating piece. The second embodiment of a tuning-fork type piezoelectric vibrating piece has a similar plan view.

FIG. 1 is a plan view of the first embodiment of a tuning-fork type piezoelectric vibrating piece 10A. FIG. 2A is a cross-sectional view along the line A-A FIG. 1, and FIG. 2B is a cross-sectional view along the line B-B in FIG. 1. Note that the tuning-fork type piezoelectric vibrating piece 10A shown in FIG. 1 has the same plan view from either the +Z-axis direction or the −Z-axis direction. Hence, the plan view shown in FIG. 1 can be regarded as exemplary of both plan views. The XY plane of this embodiment 10A as seen from the +Z-axis direction is an "upper main surface", and the XY plane as seen from −Z-axis direction is a "lower main surface." The same terminology is used in the various embodiments discussed later below.

As shown in FIG. 1, the first embodiment of a tuning-fork type piezoelectric vibrating piece 10A includes a base 11 that is nearly rectangular in shape and a pair of vibrating arms 12 extending from the base 11 in the +Y-axis direction. A respective "weight" 14 is situated at the distal end of each vibrating arm 12 on the +Y side. The weights 14 are used for supporting vibration of the arms and for adjusting the frequency of vibration produced by the arms. This first embodiment 10A vibrates at 32.768 kHz and is a very small crystal vibrating piece.

Each vibrating arm defines a respective groove on each main surface thereof. Shown in FIG. 1 are a first groove 13A and a second groove 13B that extend to the base 11. This embodiment 10A is symmetrical with respect to an axis Ax extending in the Y-axis direction. Since the grooves 13A and 13B are defined on both the upper and lower main surfaces, the cross-section of each vibrating arm 12 along the line A-A is substantially "H"-shaped (see FIG. 2A).

On the base 11, outboard of the grooves 13A, 13B in the vibrating arms in the X-axis direction are respective rectangular base-grooves 15A and 15B, that correspond to the respective vibrating-arm grooves 13A, 13B extending to the base 11. Each vibrating-arm groove 13A, 13B and each base-groove 15A, 15B has a respective bottom surface and respective side surfaces. I.e., each "groove" is defined as having a respective bottom surface and respective side surfaces extending completely around the bottom surface. For example, the first vibrating-arm groove 13A comprises a rectangular bottom surface M11 (see FIGS. 2A and 2B) and four side surfaces M21 (four sides shown in FIG. 1). The second vibrating-arm groove 13B also comprises a rectangular bottom surface M12 (see FIGS. 2A and 2B) and four side surfaces M22. The first base-groove 15A comprises a rectangular bottom surface M31 (see FIG. 2B), one side surface M41 and three side surfaces M51 extending around the circumference of the bottom surface. The second base-groove 15B also comprises a rectangular bottom surface M32 (see FIG. 2B), one side surface M42, and three side surfaces M52 extending around the circumference of the bottom surface. The first base-groove 15A and second base-groove 15B are formed on respective outer edges of the vibrating arms. As a result, the tuning-fork type piezoelectric vibrating piece 10A is stronger than it otherwise would be if the base-grooves were formed on the inner edges of the vibrating arms 12.

As shown in FIG. 1, by way of example, the length L1 of the base 11 in the Y-axis direction is about 500 to 600 μm. The length L2 of a vibrating arm 12 extending from the base 11 in the Y-axis direction is about 1400 to 1500 μm. The length L3 of each vibrating-arm groove 13A, 13B in the Y-axis direction is about 400 to 1360 μm. The length L4 of each base-groove 15A, 15B in the Y-axis direction is about 150 to 400 μm.

According to the dimensions in the Y-axis direction mentioned above, the ratio of the length L3 of each vibrating-arm groove 13A, 13B to the entire length (L1+L2) of the piezoelectric vibrating piece 10A is within a range about 0.2 to 0.68. As a result, this embodiment can suppress unnecessary vibrations and reduce second-order harmonic vibrations (about 6.3× the fundamental harmonic frequency). Thus, this embodiment 10A vibrates readily at a fundamental harmonic mode. More particularly, the equivalent series resistance of the piezoelectric vibrating piece 10A vibrating at the fundamental harmonic mode is less than the equivalent series resistance at second-order harmonic vibration.

Meanwhile, according to this example and as shown in FIG. 1, the width W1 of the base 11 in the X-axis direction is about 500 to 600 μm. The width W2 of each vibrating arm 12 in the X-axis direction is about 80 to 120 μm. The distance W3 between the vibrating arms 12 is about 100 μm. The width W4 of each vibrating-arm groove 13A, 13B in the X-axis direction is about 10 to 100 μm. The width W5 of each base-groove 15A, 15B is about 50 to 150 μm.

The ratio of the width W4 to the width W2 is within a range about 0.50 to 0.85. Electromechanical conversion efficiency is improved by such a ratio.

Further to this example and as shown in FIGS. 2A and 2B, the thickness H1 of the piezoelectric vibrating piece 10A in the X-axis direction is about 30 to 120 μm. The depth H2 of each vibrating-arm groove 13A, 13B (equal to the depth H2 of each base-groove 15A, 15B) in the Z-axis direction is about 20 to 50 μm.

With dimensions in the Z-axis direction being as described above, the ratio of the depth H2 to the thickness H1 is within a range of about 0.25 to 0.4. With such dimensions, the electric field $E_x$ of the vibrating arms 12 is increased to provide a vibrating piece having high electromechanical conversion efficiency and low equivalent series resistance.

Referring further to FIG. 1, a respective rectangular base electrode 16A, 16B (having different respective polarities) is situated at each corner of the base 11 on the −Y side. A respective groove-excitation electrode 17A is formed on the respective vibrating-arm groove 13A on each of the upper and lower main surfaces of one vibrating arm 12. Similarly, a respective groove-excitation electrode 17B is formed on the respective vibrating-arm groove 13B on each of the upper and lower main services of the other vibrating arm 12. The respective groove-excitation electrodes on each vibrating arm 12 have different respective polarities. Side-surface excitation electrodes 121A, 121B are formed on these side surfaces of each vibrating arm. More specifically, each side surface of one vibrating arm (the +X vibrating arm) has a respective side-surface excitation electrode 121A, and each side surface of the other vibrating arm (the −X vibrating arm) has a respective side-surface excitation electrode 121B. The polarity of the side-surface excitation electrodes 121A is different from the polarity of the side-surface excitation electrodes 121B. Each weight 14 comprises a respective metal film that connects both respective side-surface excitation electrodes 121A, 121B together.

The base electrode 16A is connected to the side-surface excitation electrodes 121A via a connecting electrode 18A, which also connects together the groove excitation electrodes 17A. Similarly, the base electrode 16B is connected to the side-surface excitation electrodes 121B via a connecting electrode 18B, which also connects together the groove excitation electrodes 17B. According to such a configuration, the base electrode 16A conducts to the side-surface excitation electrodes 121A and the groove excitation electrode 17A, and the base electrode 16B conducts to the side-surface excitation electrodes 121B and the groove excitation electrode 17B. Whenever the base electrodes 16A, 16B are connected to external electrodes 117 (see FIG. 17A) using electrically conductive adhesive 115 (see FIG. 17A) applied on the "connecting regions" CA (denoted by dotted-lines), the external electrodes are connected to respective excitation electrodes to electrically excite vibration of the vibrating arms 12.

The connecting electrode 18A for connecting together the base electrode 16A and the side-surface excitation electrodes 121A of the +X vibrating arm 12 has a width extending slightly (in the X-axis direction) over the first base-groove 15A. Similarly, the connecting electrode 18B for connecting the base electrode 16B and the side-surface excitation electrodes 121B of the −X vibrating arm has a width extending slightly (in the X-axis direction) over the second base-groove 15. As a result, a base-groove electrode 19A is formed on the side surface M41 of the first base-groove 15A, and a base-groove electrode 19B is formed on the side surface M42 of the second base-groove 15B. In this embodiment, the connecting electrodes 18A, 18B extend over the side surfaces M41, M42 of the first and second base-grooves 15A, 15B, respectively. Alternatively, they can be formed over the bottom surfaces M31, M32 of the first and second base-grooves 15A, 15B, respectively. I.e., the connecting electrodes 18A, 18B can be formed on the bottom surfaces M31, M32 of the first and second base-grooves 15A, 15B, respectively.

In this embodiment of a tuning-fork type piezoelectric vibrating piece 10A, the base electrode 16A, groove-excitation electrode 17A, side-surface excitation electrode 121A, connecting electrode 18A, and base-groove electrode 19A all have the same polarity. Similarly, the base electrode 16B, groove-excitation electrode 17B, side-surface excitation electrode 121B, connecting electrode 18B, and base-groove electrode 19B all have the same polarity. Each of these electrodes desirably is formed as a gold (Au) layer of 200 Å to 3000 Å thickness formed on a chromium (Cr) layer of 50 Å to 700 Å thickness. Instead of the chromium (Cr) layer, a tungsten (W) layer, a nickel (Ni) layer, or a titanium (Ti) layer can be used. Instead of the gold (Au) layer, a silver (Ag) layer can be used.

The components of the electric field $E_x$ produced by the piezoelectric vibrating piece 10A is now described with reference to FIGS. 2A and 2B. As shown in FIG. 2A, each vibrating arm 12 has a substantially "H" shape on the XZ plane. Whenever a square-wave driving signal (alternating positive and negative DC voltage) is applied to the groove excitation electrodes 17A, 17B and the side-surface electrodes 121A, 121B as explained above, the groove excitation electrode 17A and side surface excitation electrodes 121A assume a same first polarity, and the groove excitation electrode 17B and side-surface excitation electrodes 121B assume a same second polarity (opposite the first polarity).

Thus, respective electric fields $E_x$ are produced that extend along the arrow directions between the groove excitation electrode 17A and side-surface excitation electrodes 121B and between the groove excitation electrode 17B and side-surface excitation electrodes 121A. The electric field $E_x$ extends in the X-axis direction in the vibrating arm 12, i.e., perpendicular to the groove excitation electrodes 17A, 17B and the side-surface excitation electrodes 121A, 121B (formed parallel to each other), so that the electric field increases. As a result, even if this embodiment of a tuning-fork type piezoelectric vibrating piece 10A is miniaturized, it still exhibits low equivalent series resistance and high Q value.

As shown in FIG. 2B, when the square-wave driving signal applied to the groove excitation electrodes 17A, 17B and the base-groove electrodes 19A, 19B, the groove excitation electrode 17A and the base-groove electrodes 19A assume a respective same polarity, and the groove excitation electrode 17B and the base-groove electrodes 19B assume a respective same polarity. Thus, an electric field $E_x$ is generated that extends in the arrow directions between the groove excitation electrode 17A and the base-groove electrodes 19B, and between the groove excitation electrode 17B and the base-groove electrodes 19A. The electric field $E_x$ extends in the X-axis direction in the vibrating arm 12, i.e., perpendicular to the groove excitation electrodes 17A, 17B and base-groove electrodes 19A, 19B (formed parallel to each other), so that the electric field increases. As a result, even if this embodiment of a tuning-fork type piezoelectric vibrating piece 10A is miniaturized, it still exhibits low equivalent series resistance.

Second Embodiment of Tuning-Fork Type Piezoelectric Vibrating Piece

A tuning-fork type piezoelectric vibrating piece 10B according to a second embodiment is described below with reference to FIGS. 1 and 3. This embodiment 10B has the same shape as the first embodiment 10A when viewed from the Z-axis direction. In FIG. 1 features of the second embodiment are denoted by respective reference numerals in parentheses. FIG. 3 is a cross-sectional view along the line B-B in FIG. 1. The same respective reference numerals are used for denoting components that are the same as respective components in the first embodiment.

In FIG. 1 a respective through-hole 25A, 25B, each being rectangularly shaped, is defined in each outboard region (in the X-axis direction) of the base 21. The through-holes 25A, 25B are also outboard of the respective vibrating-arm grooves 13A, 13B. Hence, each through-hole 25A, 25B corresponds to a respective vibrating-arm groove 13A, 13B.

In this description, a "through-hole" is a hole or void that does not include a bottom surface. Rather, a through-hole comprises only side surfaces. Each through hole extends completely through the thickness dimension of the piezoelectric vibrating piece. For example, the first through-hole 25A comprises one side surface M61 and three side surfaces M71 that collectively form a rectangularly shaped void in the XY plane. Similarly, the second through-hole 25B comprises one side surface M62 and three side surfaces M72 that collectively form a rectangularly shaped void in the XY plane.

In FIG. 1, by way of example, the length L4 in the Y-axis direction of the first and second through-holes 25A, 25B is about 150 to 400 μm, and the width W5 in the X-axis direction of the first and second through-holes 25A, 25B is about 50 to 150 μm. As shown in FIG. 3, the first and second through-holes 25A, 25B extend completely through the thickness dimension of the piezoelectric vibrating piece 10B, from the upper main surface to the lower main surface thereof. The thickness of the piezoelectric vibrating piece 10B in the Z-axis direction is about 80 to 120 μm.

The connecting electrode 18A, used for connecting the base electrode 16A with the +X-side excitation electrodes 121A, extends slightly over (in the X-axis direction) the first through-hole 25A. Similarly, the connecting electrode 18B, used for connecting the base electrode 16B with the −X-side excitation electrodes 121B, extends slightly over (in the X-axis direction) the second through-hole 25B. A through-hole electrode 29A is formed on the side surface M61 of the first through-hole 25A, and a through-hole electrode 29B is formed on the side surface M62 of the second through hole 25B.

The base electrode 16A, groove-excitation electrode 17A, side-surface excitation electrodes 121A, connecting electrode 18A, and the through-hole electrode 29A have the same polarity when energized. The base electrode 16B, groove-excitation electrode 17B, side-surface excitation electrodes 121B, connecting electrode 18B, and through-hole electrode 29A have the same polarity.

As shown in FIG. 3, whenever a square-wave (plus and minus) voltage is applied to the groove-excitation electrodes 17A, 17B, the through-hole electrodes 29A, 29B, groove-excitation electrode 17A, and through-hole electrodes 29A assume the same electrical polarity, and the groove-excitation electrode 17B and through-hole electrodes 29B assume the same polarity. This produces an electric field $E_x$ that extends in the arrow directions between the groove-excitation electrode 17A and through-hole electrodes 29B, and between the groove-excitation electrode 17B and through-hole electrodes 29A. The electric field $E_x$ extends in the X-axis direction in the vibrating arm 12, i.e., perpendicular to the groove-excitation electrodes 17A, 17B and respective through-hole electrodes 29A, 29B (which are formed parallel to each other), which enhances the electric field. Consequently, even when miniaturized, the second embodiment of a tuning-fork type piezoelectric vibrating piece 10B exhibits low equivalent series resistance and a high Q value.

Third Embodiment of Tuning-Fork Type Piezoelectric Vibrating Piece

Figure 4:
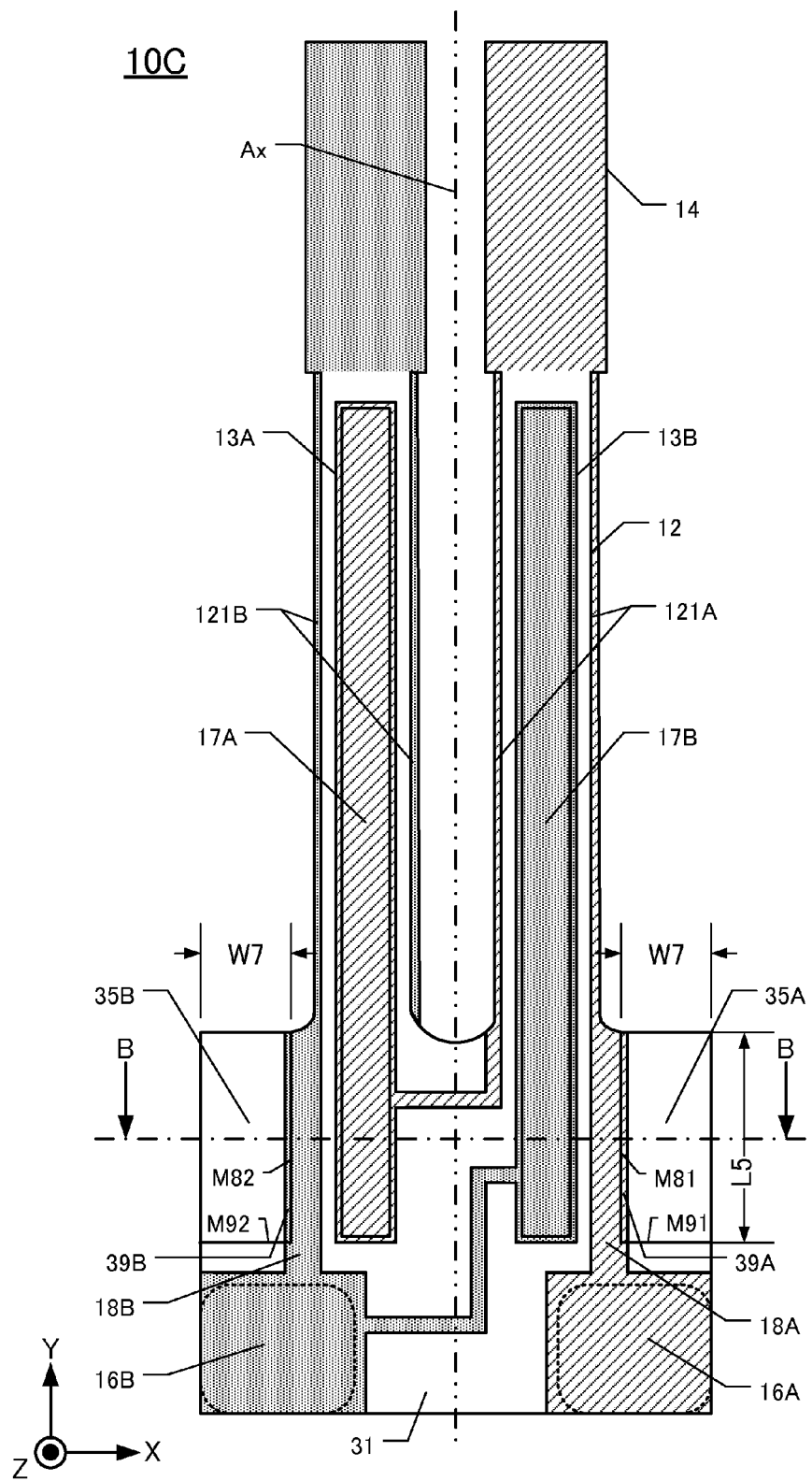
FIG. 4 is a plan view of a third embodiment of a tuning-fork type piezoelectric vibrating piece.
Figure 5:
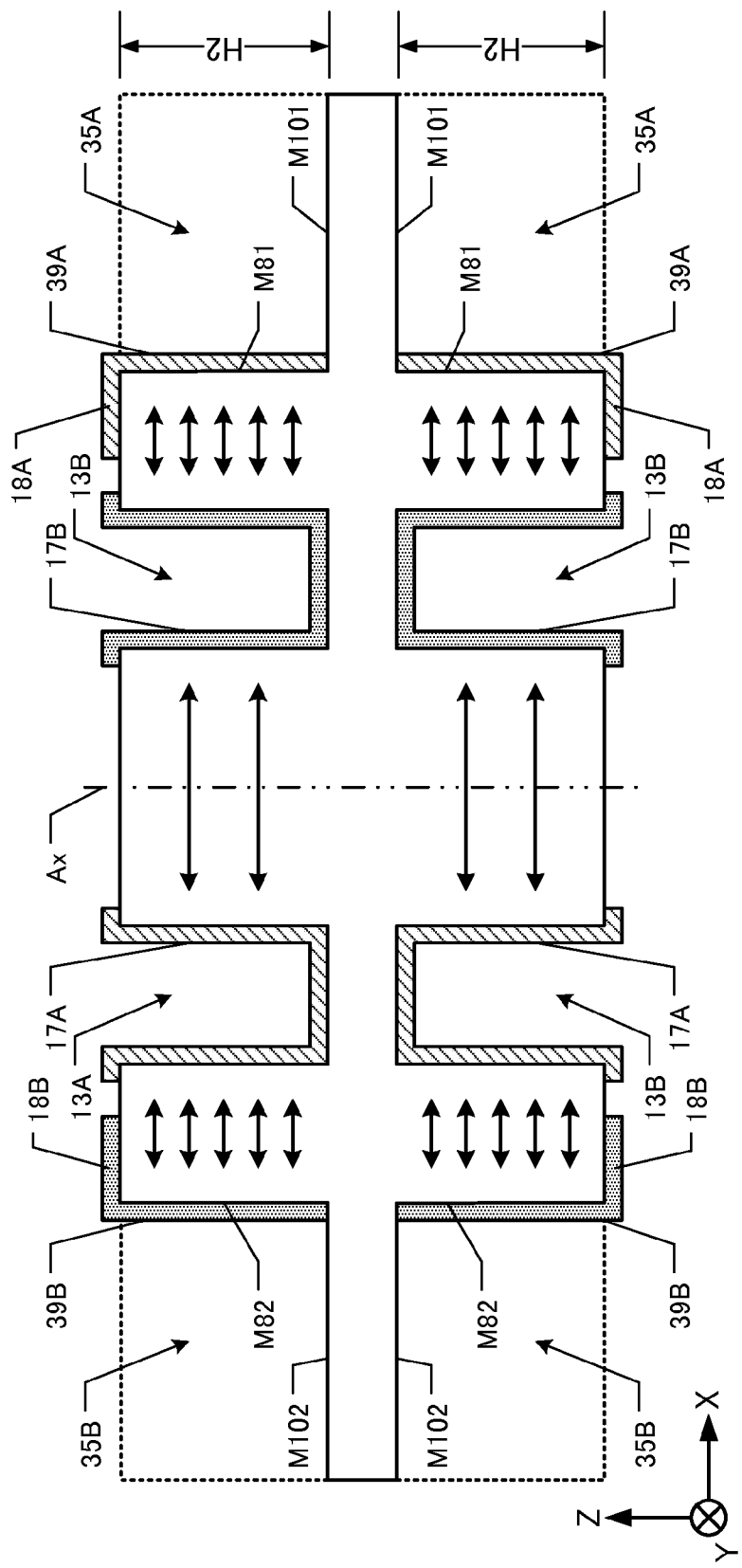
FIG. 5 is a cross-sectional view along the line B-B in FIG. 4.

This embodiment 10C of a tuning-fork type piezoelectric vibrating piece 10C is described below with reference to FIGS. 4 and 5. FIG. 4 is a plan view of the vibrating piece 10C, and FIG. 5 is a cross-sectional view along the line B-B of FIG. 4. Complements in this embodiment that are similar to corresponding components in the first embodiment are denoted using the same respective reference numerals.

Referring to FIG. 4, this embodiment includes a pair of notches having rectangular shapes, namely a first notch 35A and a second notch 35B. Each notch 35A, 35B is situated in a respective outboard region of the base 31 and outboard (in the X-axis direction) of the respective vibrating-arm groove 13A, 13B. Thus, each notch 35A, 35B corresponds to a respective vibrating-arm groove 13A, 13B that extends to the base 31.

In this description a "notch" is defined as comprising a respective bottom surface and respective side surfaces. For example, as shown in FIGS. 4 and 5, the notch 35A comprises a bottom surface M101, one side surface M81 on the YZ plane, and one side surface M91 on the XZ plane. Similarly, the notch 35B comprises a bottom surface M102, one side surface M82 on the YZ plane, and one side surface M92 on the XZ plane.

Each "groove", "through-hole", and "notch" as described above represents a respective "step" from the main surface into the thickness dimension of the vibrating piece (especially of the base). Thus, each groove, through-hole, and notch has at least one respective side surface, referred to herein as respective "step-side surfaces".

As shown in FIG. 4, by way of example, the length L5 (in the Y-axis direction) of each notch 35A and 35B is about 150 to 450 μm, and the width W7 (in the X-axis direction) of each notch 35A, 35B is about 100 to 200 μm. As shown in FIG. 5, the depth H2 of each notch 35A and 35B is about 20 to 50 μm.

The connecting electrode 18A, used for connecting together the base electrode 16A and the +X-side excitation electrodes 121A, extends slightly over (in the X-axis direction) the first notch 35A. Similarly, the connecting electrode 18B, used for connecting together the base electrode 16B and the −X-side surface excitation electrodes 121B, extends slightly over (in the X-axis direction) the second notch 35B. Thus, a notch electrode 39A is formed on the side surface M81 of the notch 35A, and a notch electrode 39B is formed on the side surface M82 of the second notch 35B. The connecting electrodes 18A, 18B extend over the side surfaces M81, M82 of the first and second notches 35A, 35B, respectively, in the X-axis direction. Alternatively, the connecting electrodes 18A, 18B can extend over the bottom surfaces M101, M102 of the first and second notches 35A, 35B, respectively.

The base electrode 16A, groove-excitation electrode 17A, side-surface excitation electrodes 121A, connecting electrode 18A, and notch electrode 39A of this embodiment have the same electrical polarity when energized. The base electrode 16B, groove-excitation electrode 17B, side-surface excitation electrodes 121B, connecting electrode 18B, and notch electrode 39B have the same, but opposite, polarity.

As shown in FIG. 5, whenever a square-wave driving signal is applied to the groove-excitation electrodes 17A, 17B and notch electrodes 39A, 39B, the groove-excitation electrode 17A and notch electrode 39A assume the same polarity, and the groove-excitation electrode 17B and notch electrode 39B assume the same (but opposite) polarity. The resulting electric field $E_x$ extends in the arrow directions between the groove-excitation electrode 17A and respective notch electrode 39B, and between the groove-excitation electrode 17B and respective notch electrode 39A. This produces an enhanced electric field $E_x$ in the X-axis direction in the vibrating arms 12 (perpendicular to the groove-excitation electrodes 17A, 17B and the notch electrodes 39A, 39B, which are formed in parallel with each other, which enhances the electric field. As a result, even if this embodiment of a piezoelectric vibrating piece 10C is miniaturized, it nevertheless exhibits low equivalent series resistance and a high Q value.

Fourth Embodiment of a Tuning-Fork Type Piezoelectric Vibrating Piece

A tuning-fork type piezoelectric vibrating piece 10D of this embodiment is described below with reference to FIG. 6, which is a plan view. In this embodiment, components that are similar to corresponding components in the first embodiment have the same respective reference numerals.

Figure 6:
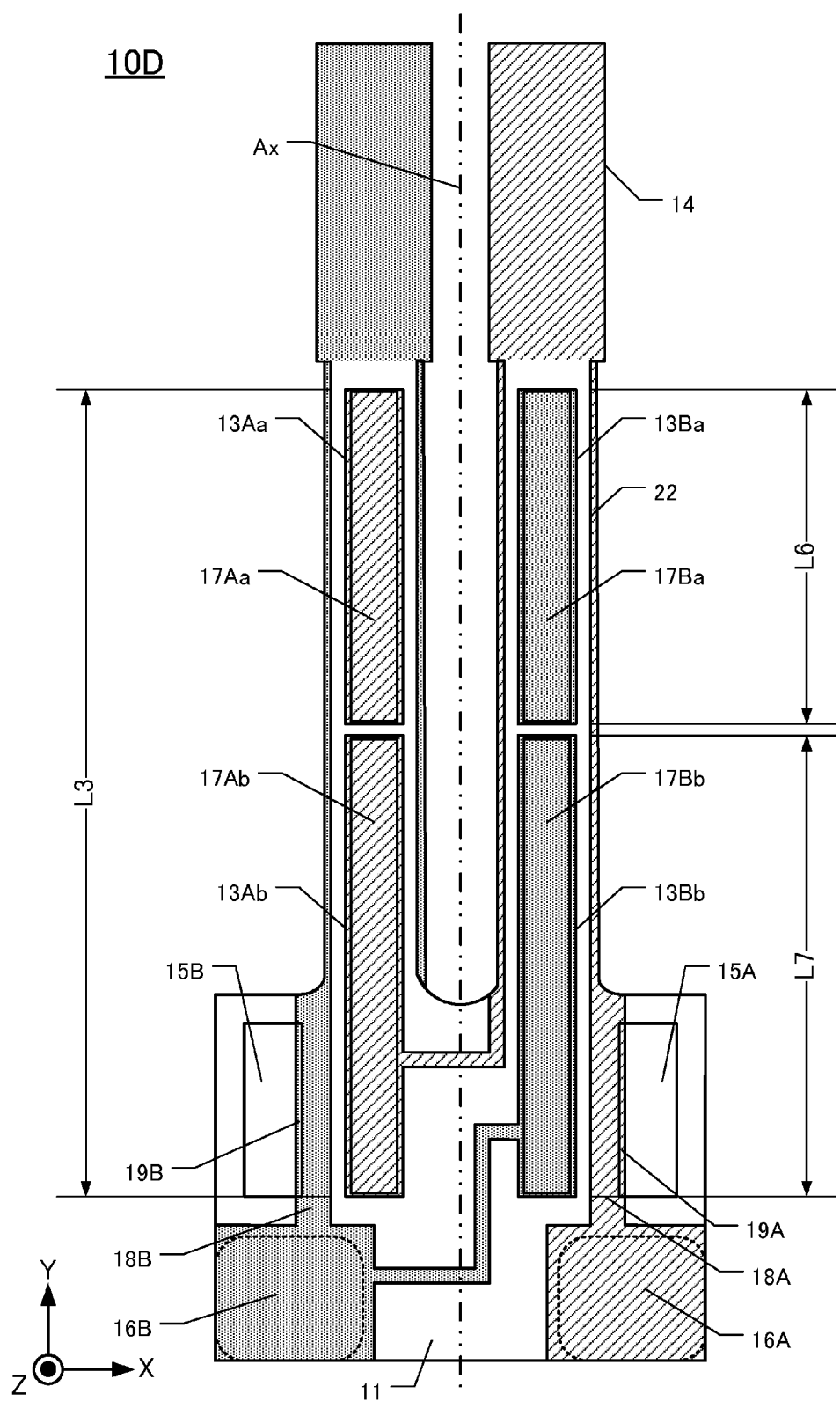
FIG. 6 is a plan view of a fourth embodiment of a tuning-fork type piezoelectric vibrating piece.

In FIG. 6 each vibrating arm defines two groove portions on each main surface thereof. In other words, in this embodiment each vibrating-arm groove that is entire in the first embodiment is divided. Specifically, the first vibrating-arm groove 13A on the left-hand vibrating arm 22 is divided into two excitation-groove portions 13Aa, 13Ab, and the second vibrating-arm groove 13B on the right-hand vibrating arm 22 is divided into two excitation-groove portions 13Ba, 13Bb.

The same configuration of divided grooves is also present on the lower main surface of the vibrating arms 22. Dividing the vibrating-arm grooves in this manner enhances the strength of the vibrating arms, which inhibits increases in equivalent series resistance, and reduces stress at flection points in the arms as they are vibrating.

By way of example, each excitation-groove portion 13Aa, 13Ba in the Y-axis direction is about 200 to 680 μm, and each excitation-groove portion 13Ab, 13Bb in the Y-axis direction is about 200 to 680 μm. The length of the excitation-groove portions 13Aa, 13Ba can be the same as or different from the length of the excitation-groove portions 13Ab, 13Bb.

Fifth Embodiment of a Tuning-Fork Type Piezoelectric Vibrating Piece

Figure 7:
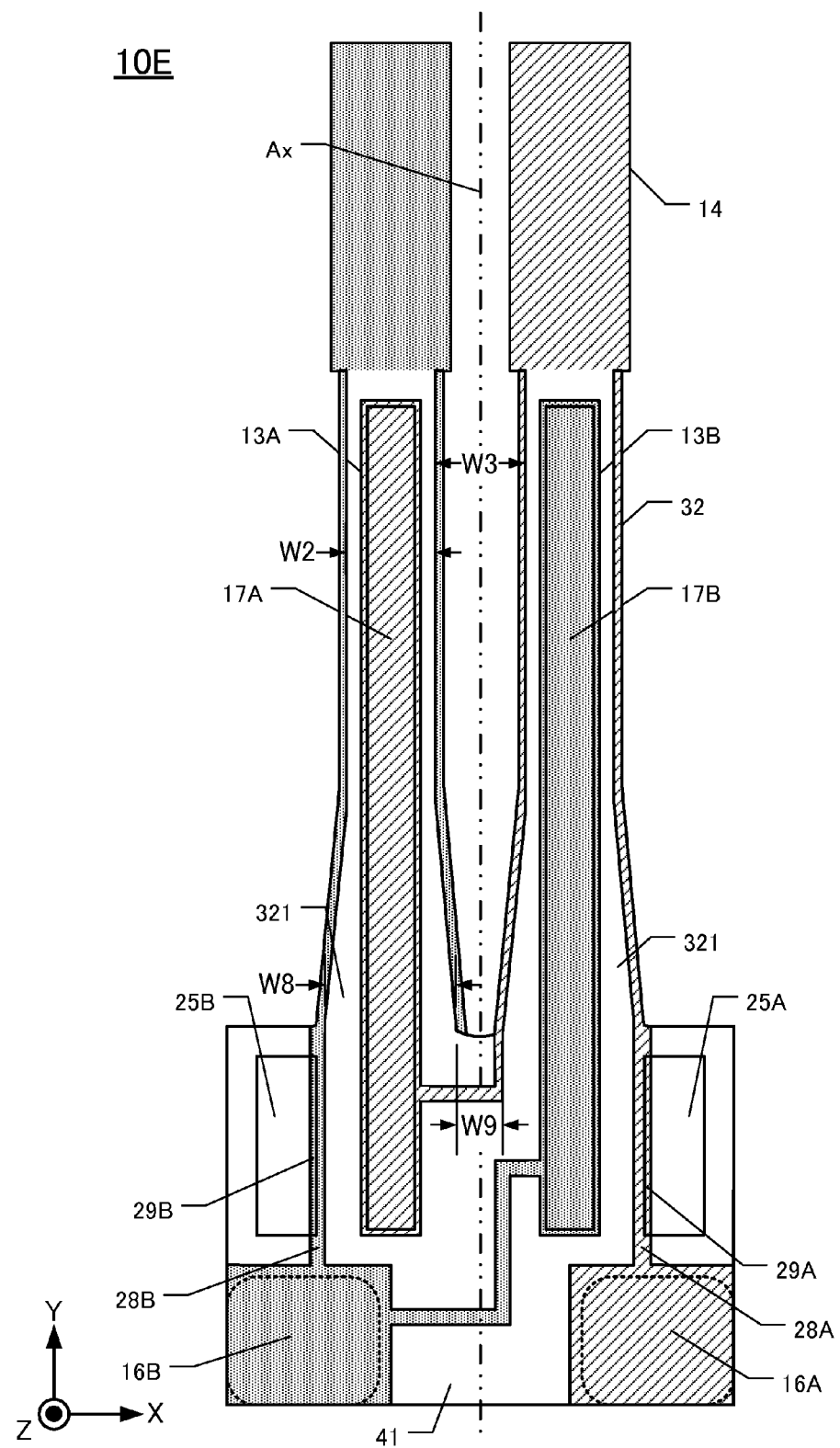
FIG. 7 is a plan view of a fifth embodiment of a tuning-fork type piezoelectric vibrating piece.

This embodiment of a piezoelectric vibrating piece 10E is described below with reference to FIG. 7, which is a plan view. In FIG. 7 components that are similar to corresponding components in the first embodiment have the same respective reference numerals.

In FIG. 7, each vibrating arm 32 includes a respective vibrating-arm groove 13A, 13B on each main surface thereof. Each groove 13A, 13B extends onto the base 41, which can reduce the strength of the vibrating arms 32. To prevent this strength reduction, the root portions 321 of each vibrating arm are wider toward the base 41. As a result, the vibrating arms 32 vibrate stably, and the reliability of this embodiment 10E is not compromised by the grooves.

By way of example, the width W2 in the X-axis direction of each vibrating arm near its respective weight 14 is about 80 to 120 μm. The distance W3 between the vibrating arms 32 at this location is about 100 μm. The width W8 of each root portion 321 in the X-axis direction (near the base 41) is about 100 to 150 μm. The distance W9 between the root portions 321 in this location is about 60 μm.

Sixth Embodiment of a Tuning-Fork Type Piezoelectric Vibrating Piece

Figure 8:
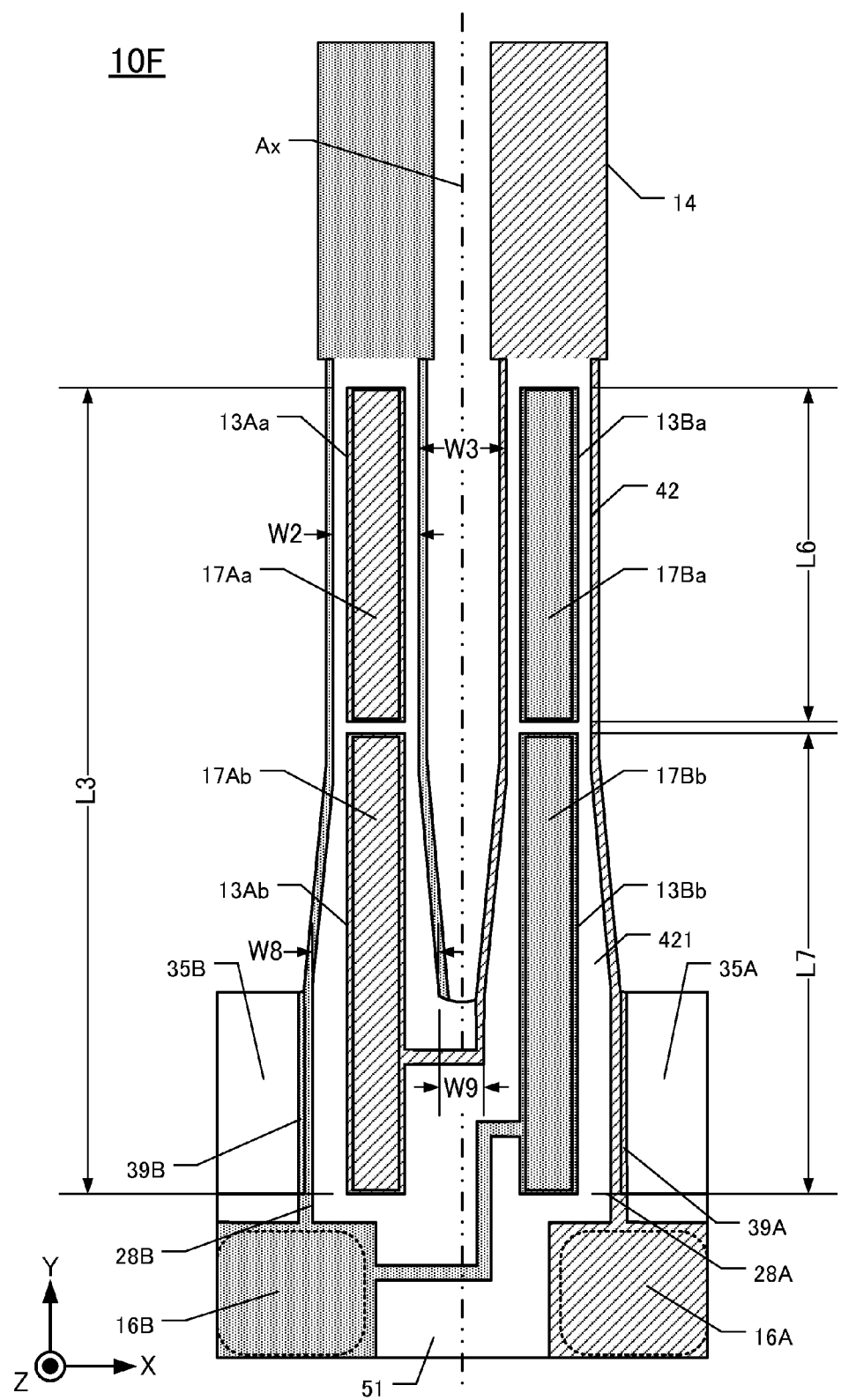
FIG. 8 is a plan view of a sixth embodiment of a tuning-fork type piezoelectric vibrating piece.

This embodiment of a piezoelectric vibrating piece 10F it is described below with reference to FIG. 8, which is a plan view. In FIG. 8 components that are similar to corresponding components in the first embodiment have the same respective reference numerals.

In FIG. 8, the vibrating-arm groove 13A defined in the upper main surface of the left-hand vibrating arm 42 is divided into two excitation-groove portions 13Aa, 13Ab. Similarly, the vibrating-arm groove 13B defined in the upper main surface of the right-hand vibrating arm is divided into two excitation-groove portions 13Ba, 13Bb. Similar divisions of the vibrating-arm grooves are present on the lower main surface. This configuration enhances the strength of the vibrating arms, prevents increases in equivalent series resistance, and reduces stress at vibration flection points.

The vibrating-arm groove portions 13Ab, 13Bb extend well into the base 51, which can reduce the strength of the vibrating arms 42. To prevent such weakening, each arm has a respective root portion 421 that is wider toward the base 52. This configuration allows the arms 42 to vibrate more stably, which increases the reliability of this embodiment.

Seventh Embodiment of a Tuning-Fork Type Piezoelectric Vibrating Piece

Figure 9:
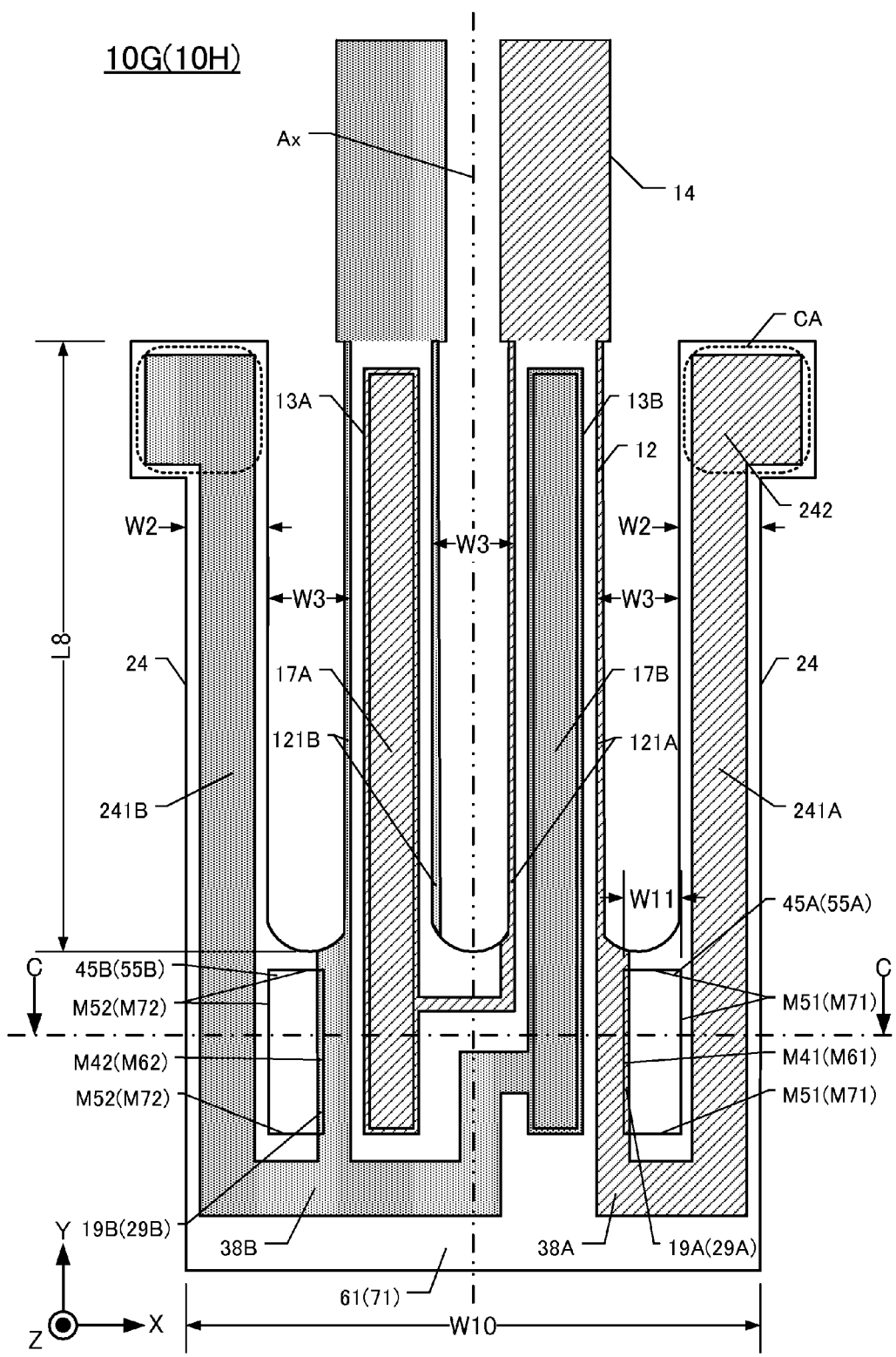
FIG. 9 is a plan view of a seventh embodiment and eighth embodiment of a tuning-fork type piezoelectric vibrating piece.
Figure 10:
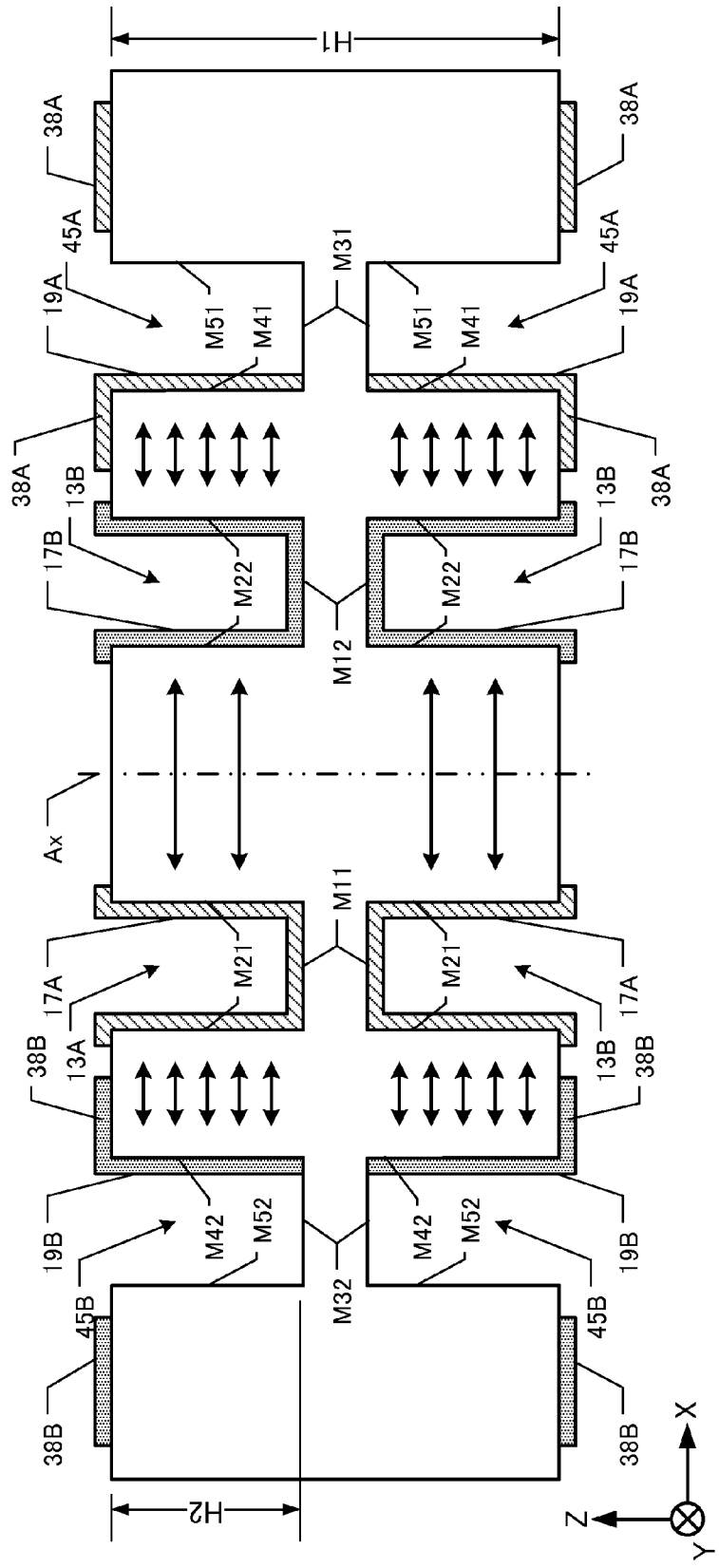
FIG. 10 is a cross-sectional view along the line C-C in FIG. 9, pertaining to the seventh embodiment.

This embodiment 10G is described with reference to FIGS. 9 and 10. FIG. 9 is a plan view, and FIG. 10 is a cross-sectional view along the line C-C in FIG. 9. In these figures, components that are similar to corresponding components in the first embodiment have the same respective reference numerals.

In FIG. 9, the piezoelectric vibrating piece 10G is symmetrical with respect to an axis Ax extending in the Y-axis direction. The vibrating piece 10G comprises a base 61 that is substantially rectangular in shape. Extending from the base 61 in the +Y-axis direction is a pair of vibrating arms 12. The distal terminus of each vibrating arm 12 includes a respective weight 14. The weights facilitate arm vibration and adjustment of vibration frequency. By way of example this piezoelectric vibrating piece 10G vibrates at 32.768 kHz and is very small.

On each main surface of each vibrating arm 12 is a respective groove 13A, 13B. The grooves 13A, 13B extend into the base 41. The vibrating piece 10G also comprises a pair of supporting arms 24. Each supporting arm 24 is outboard (in the X-axis direction) of the respective vibrating arm 12 and extends from the base 61 in the +Y-axis direction. The supporting arms 24 effectively reduce external vibration leakage from the vibrating arms 12. The supporting arms 24 also prevent the package PK (see FIG. 17B) from being adversely affected by external temperature changes and provide resistance to physical shocks.

Each supporting arm 24 includes a terminus 242 that is wider (in the X-axis direction) than most of the supporting arm 24. The wider terminus 242 allows a larger connecting region CA (dotted-line) in which electrically conductive adhesive 215 (FIG. 17B) is applied. More adhesive area allows the vibrating piece 10G to be mounted more securely in the package PK.

This embodiment 10G also includes a pair of rectangular base-grooves 45A, 45B located in the base 61. Each base-groove 45A, 45B is located outboard (in the X-axis direction) of the respective vibrating-arm groove 13A, 13B. The base-grooves 45A, 45B effectively reduce vibration leakage from the vibrating arms 12 to outside the package.

By way of example, the entire width W10 of this embodiment of a piezoelectric vibrating piece 10G is about 400 to 700 μm. The length L8 of each supporting arm 24 is about 300 to 800 μm, and the width W2 of each vibrating arm 24 is about 80 to 120 μm. The distance W3 between the left-hand supporting arm 24 and left-hand vibrating arm 12 (which is equal to the distance between the right-hand supporting arm 24 and right-hand vibrating arm 12, and which is equal to the distance between the vibrating arms 12 is about 100 μm. The width W11 of each base-groove 45A, 45B is about 30 to 250 μm. The first and second base-grooves 45A, 45B need not be placed between the supporting arms 24 and respective vibrating arms 12. But, whenever a base-groove 45A, 45B is placed between the respective supporting arm 24 and respective vibrating arm 12, the width 11 is about 30 to 100 μm and can be formed over the region of the base where the supporting arms 24 extend in the −Y-axis direction. As shown in FIG. 10, the depth H2 of the base-grooves 45A, 45B is about 20 to 50 μm.

As shown in FIG. 9, the groove-excitation electrodes 17A, 17B, having respective polarities (when electrically energized) that differ from each other, are formed on respective vibrating-arm grooves 13A, 13B. The left-hand vibrating arm 12 includes a respective pair of side-surface excitation electrodes 121A (one on each longitudinal side). Similarly, the right-hand vibrating arm 12 includes a respective pair of side-surface excitation electrodes 121B (one on each longitudinal side).

The left-hand supporting arm 24 includes an extraction electrode 241A that extends in the Y-axis direction. Similarly, the right-hand supporting arm 24 includes an extraction electrode 241B that extends in the Y-axis direction. The extraction electrodes 241A, 241B extend (in the +Y-axis direction) to the respective wider distal ends 242 of the supporting arms. The extraction electrodes 241A, 241B also extend (in the −Y-axis direction) to the base 61. The extraction electrode 241A is connected to the side-surface excitation electrode 121A via a connecting electrode 38A that also connects the side-surface excitation electrode 121A to the groove-excitation electrode 17A. Similarly, the extraction electrode 241B is connected to the side-surface excitation electrode 121B via a connecting electrode 38B that also connects the side-surface excitation electrode 121A to the groove-excitation electrode 17B. Thus, the extraction electrode 241A is connected to the side-surface excitation electrodes 121A and to the groove excitation electrode 17A, and the extraction electrode 241B is connected to the side-surface excitation electrodes 121B and to the groove excitation electrode 17B. When the extraction electrodes 241A, 241B are connected to the respective external electrodes 217 (see FIG. 17B) by electrically conductive adhesive 215 applied to the connecting regions CA, the external electrodes and the excitation electrodes are connected respectively to cause vibration of the vibrating arms 12 of the vibrating piece 10G.

The connecting electrode 38A, used for connecting the side-surface excitation electrode 121A to the extraction electrode 241A and to the groove excitation electrode 17A, has a width that extends slightly over the base-groove 45A. Similarly, the connecting electrode 38B, used for connecting the side-surface excitation electrode 121B to the extraction electrode 241B and to the groove-excitation electrode 17B, has a width that extends slightly over the base-groove 45B. A base-groove electrode 19A is formed on the side surface M41 of the base-groove 45A, and a base-groove electrode 19B is formed on the side surface M42 of the base-groove 45B. The connecting electrodes 38A, 38B extend over the respective side surfaces M41, M42 of the respective grooves 45A, 45B. Alternatively, the connecting electrodes 38A, 38B can extend over respective bottom surfaces M31, M32 (see FIG. 10) of the respective grooves 45A, 45B. I.e., electrodes can be formed on the bottom surfaces M31, M32 (see FIG. 10) of the base-grooves 45A, 45B.

When energized the extraction electrode 241A, groove excitation electrode 17A, side-surface excitation electrode 121A, connecting electrode 38A, and base-groove electrode 19A have the same polarity. The extraction electrode 241B, groove excitation electrode 17B, side-surface excitation electrode 121B, connecting electrode 38B, and base-groove electrode 19B have the same polarity (but opposite the polarity of the extraction electrode 241A).

Referring further to FIG. 10, whenever an alternating voltage (square wave signal) is applied to the groove excitation electrodes 17A, 17B and to the base-groove electrodes 19A, 19B, the groove excitation electrode 17A and base-groove electrodes 19A have the same polarity, while the groove excitation electrode 17B and base-groove electrodes 19B have the same (but opposite) polarity. Thus, an electric field $E_x$ is produced in the arrow directions between the groove excitation electrode 17A and the base-groove electrodes 19B, and between the groove excitation electrode 17B and the base-groove electrodes 19A. The electric field $E_x$ extends in the X-axis direction in the vibrating arm 12, i.e., the direction perpendicular to the groove excitation electrodes 17A, 17B and base-groove electrodes 19A, 19B (formed in parallel with each other). This causes the electric field to increase. This allows the tuning-fork type piezoelectric vibrating piece 10G of this embodiment to be miniaturized without adversely affecting the equivalent series resistance or high Q value.

Eighth Embodiment of Tuning-Fork Type Piezoelectric Vibrating Piece

Figure 11:
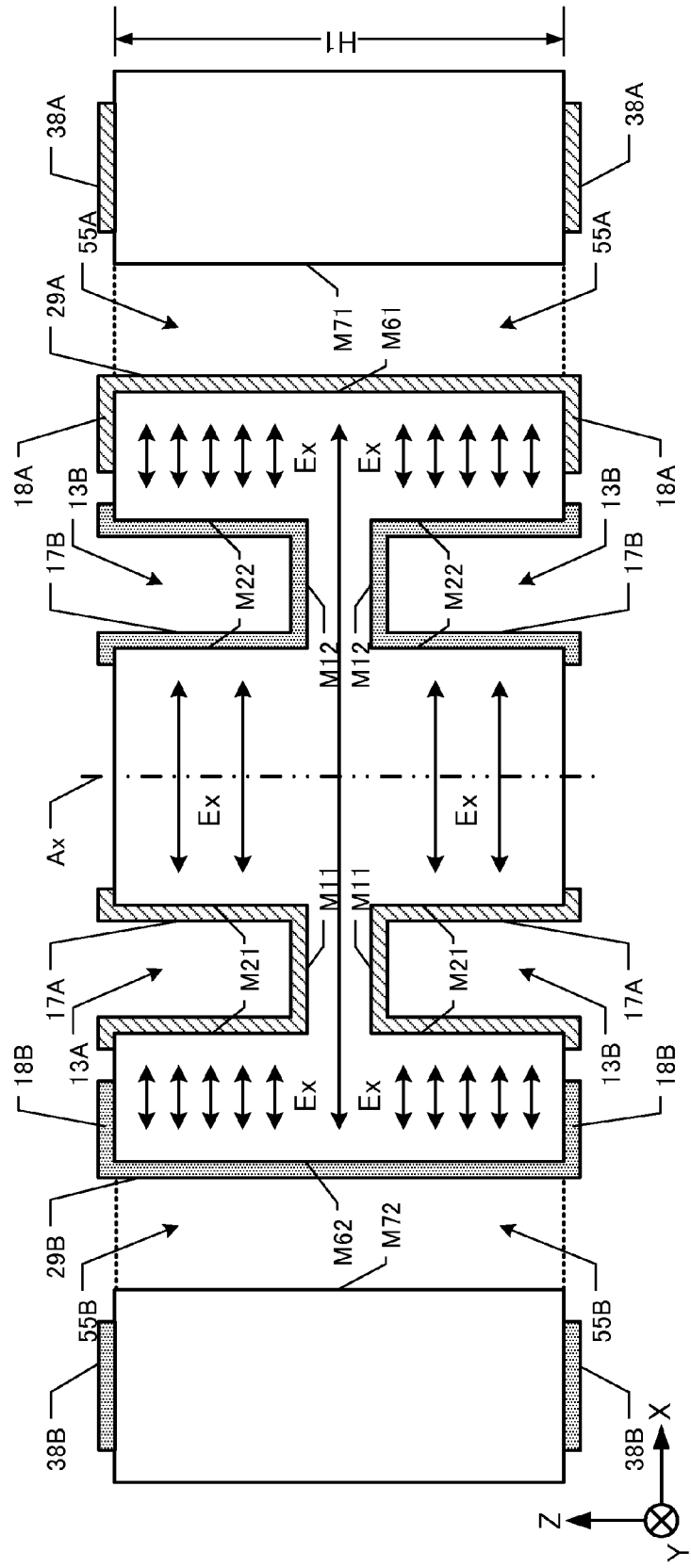
FIG. 11 is a cross-sectional view along the line C-C in FIG. 9, pertaining to the eighth embodiment.

This embodiment 10H is described below with reference to FIGS. 9 and 11. As shown in FIG. 9, this eighth embodiment has the same plan profile (as viewed from the Z-axis direction) as the seventh embodiment 10G. In FIG. 9, components of the eighth embodiment are denoted by numbers in parentheses. FIG. 11 is a cross-sectional view along the line C-C in FIG. 9. In FIG. 9, components that are similar to corresponding components in the seventh embodiment have the same respective reference numerals.

The eighth embodiment 10H comprises a pair of through-holes, namely a first through-hole 55A and a second through-hole 55B, each having a substantially rectangular shape. Each through-hole 55A, 55B is situated on the base, outboard (in the X-axis direction) of the respective vibrating-arm grooves 13A, 13B. The vibrating-arm grooves 13A, 13B extend into the base 71.

As shown in FIG. 9, and by way of example, the length L4 (in the Y-axis direction) of each through-hole 55A, 55B is about 150 to 450 μm. The width W11 of each through-hole 55A, 55B is about 100 to 250 μm. As shown in FIG. 11, each through-hole 55A, 55B extends fully through the thickness dimension of the piezoelectric vibrating piece 10H, from the upper main surface to the lower main surface. The depth H1 in the Z-axis direction is about 80 to 120 μm, which is equal to the thickness H1 of the vibrating piece 10H.

Returning to FIG. 9, the connecting electrode 38A extends slightly, in the X-axis direction, over the first through-hole 55A, and the connecting electrode 38B extends slightly, in the X-axis direction, over the second through-hole 55B. Consequently, a through-hole electrode 29A is formed on the side surface M61 of the first through-hole 55A, and a through-hole electrode 29B is formed on the side surface M62 of the second through-hole 55B.

Returning to FIG. 11, whenever a square-wave alternating voltage is applied to the groove excitation electrodes 17A, 17B and to the through-hole electrodes 29A, 29B, the groove excitation electrode 17A and through-hole electrodes 29A have the same polarity, and the groove excitation electrode 17B and the through-hole electrodes 29B become the same (but opposite) polarity. This produces an electric field $E_x$ that extends in the arrow directions between the groove excitation electrode 17A and the through-hole electrodes 29B, and between the groove excitation electrode 17B and the through-hole electrodes 29A. The electric field $E_x$ extends in the X-axis direction in the vibrating arms 12, i.e., perpendicular to the groove excitation electrodes 17A, 17B and the through-hole electrodes 29A, 29B (formed parallel to each other), which effectively increases the electric field. As a result, even when miniaturized, the eighth embodiment 10H provides a tuning-fork type piezoelectric vibrating piece exhibiting low equivalent series resonance and high Q value.

Ninth Embodiment of Tuning-Fork Type Piezoelectric Vibrating Piece

Figure 12:
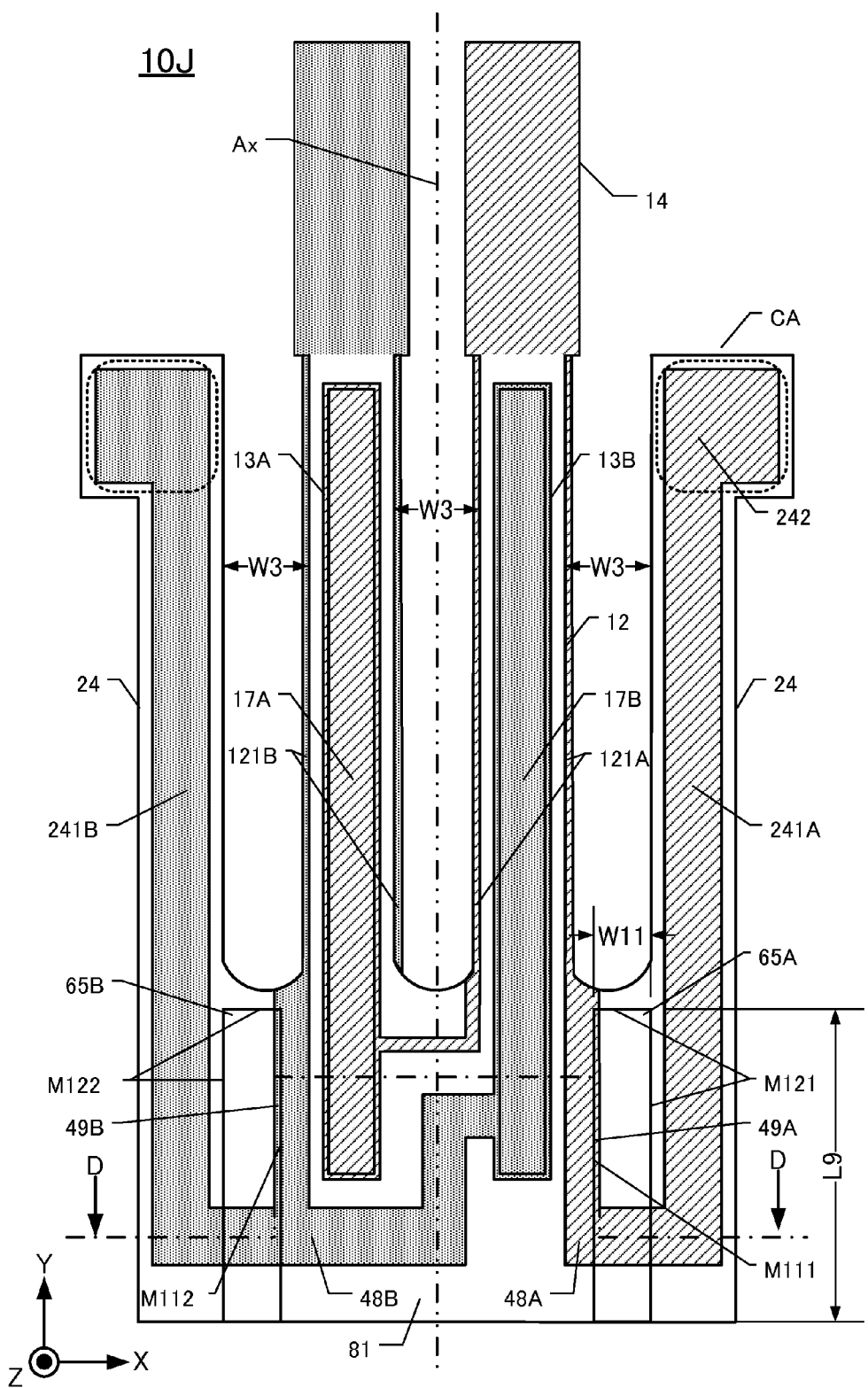
FIG. 12 is a plan view of a ninth embodiment of a tuning-fork type piezoelectric vibrating piece.
Figure 13:
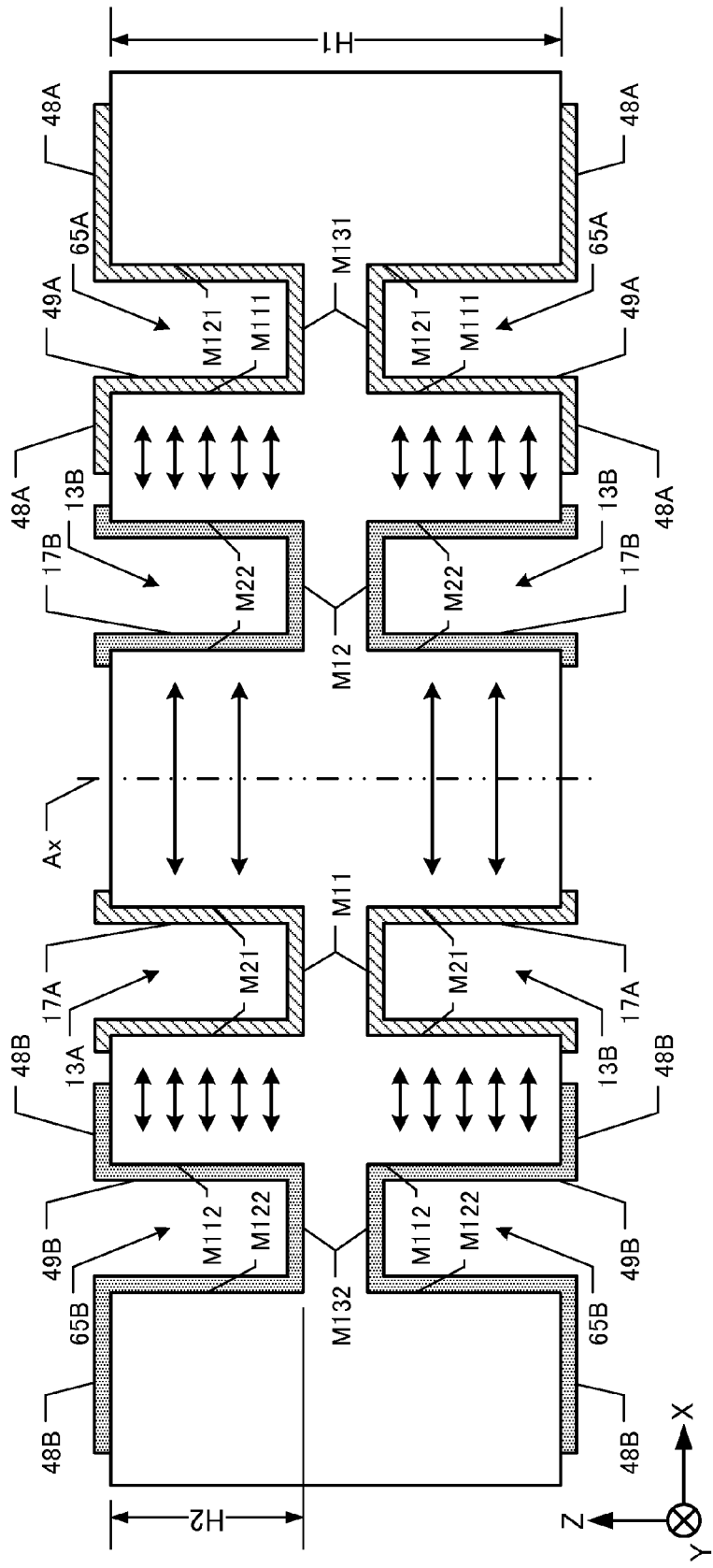
FIG. 13 is a cross-sectional view along the line D-D in FIG. 12.

This embodiment of a piezoelectric vibrating piece 10J is described below with reference to FIGS. 12 and 13. FIG. 12 is a plan view, and FIG. 13 is a cross-sectional view along the line D-D in FIG. 12. In FIG. 12, components that are similar to corresponding components of the seventh embodiment have the same respective reference numerals.

As shown in FIG. 12, first and second rectangular notches 65A, 65B are situated on the base 81 outboard (in the X-axis direction) of respective vibrating-arm groove portions 13A, 13B. Thus, the notches 65A, 65B correspond to respective vibrating-arm grooves 13A, 13B. The first notch 65A comprises a bottom surface M131 (see FIG. 13), one side surface M111, and two side surfaces M121 (there is no side surface on the −Y side). The second notch 65B comprises a bottom surface M132 (see FIG. 13), one side surface M112, and two side surfaces M122 (there is no side surface on the −Y side. The notches 65A, 65B effectively reduce leakage of arm vibrations to outside the vibrating device.

As shown in FIG. 12, and by way of example, the length L9 (in the Y-axis direction) of each notch 65A, 65B is about 100 to 500 μm. As shown in FIG. 13, the depth H2 (in the X-axis direction) of each notch 65A, 65B is about 20 to 50 μm.

Referring further to FIG. 12, the connecting electrode 48A, used for connecting the side-surface excitation electrode 121A to the extraction electrode 241A on the +X side extends slightly over the first notch 65A. Similarly, the connecting electrode 48B, used for connecting the side-surface excitation electrode 121B to the extraction electrode 241B on the −X side extends slightly over the second notch 65B. Thus, the notch electrode 49A is formed on the surface M111 of the first notch 65A, and the notch electrode 49B is formed on the surface M112 of the second notch 65B.

Referring further to FIG. 13, whenever a square-wave alternating voltage is applied to the groove excitation electrodes 17A, 17B and to the notch electrodes 49A, 49B, the groove excitation electrode 17A and notch electrode 49A have the same polarity, and the groove excitation electrode 17B and notch electrode 49B have the same (but opposite) polarity. As a result, an electric field $E_x$ is generated along the arrow directions between the groove excitation electrode 17A and the notch electrode 49B, and between the groove excitation electrode 17B and the notch electrode 49A. The electric field $E_x$ extends in the X-axis direction in the vibrating arms 12, i.e., perpendicular to the groove excitation electrodes 17A, 17B and notch electrodes 49A, 49B (which are formed parallel to each other), which results is a larger electric field. Consequently, even when miniaturized, this embodiment 10J exhibits low equivalent series resistance and high Q value.

Tenth Embodiment of Tuning-Fork Type Piezoelectric Vibrating Piece

Figure 14:
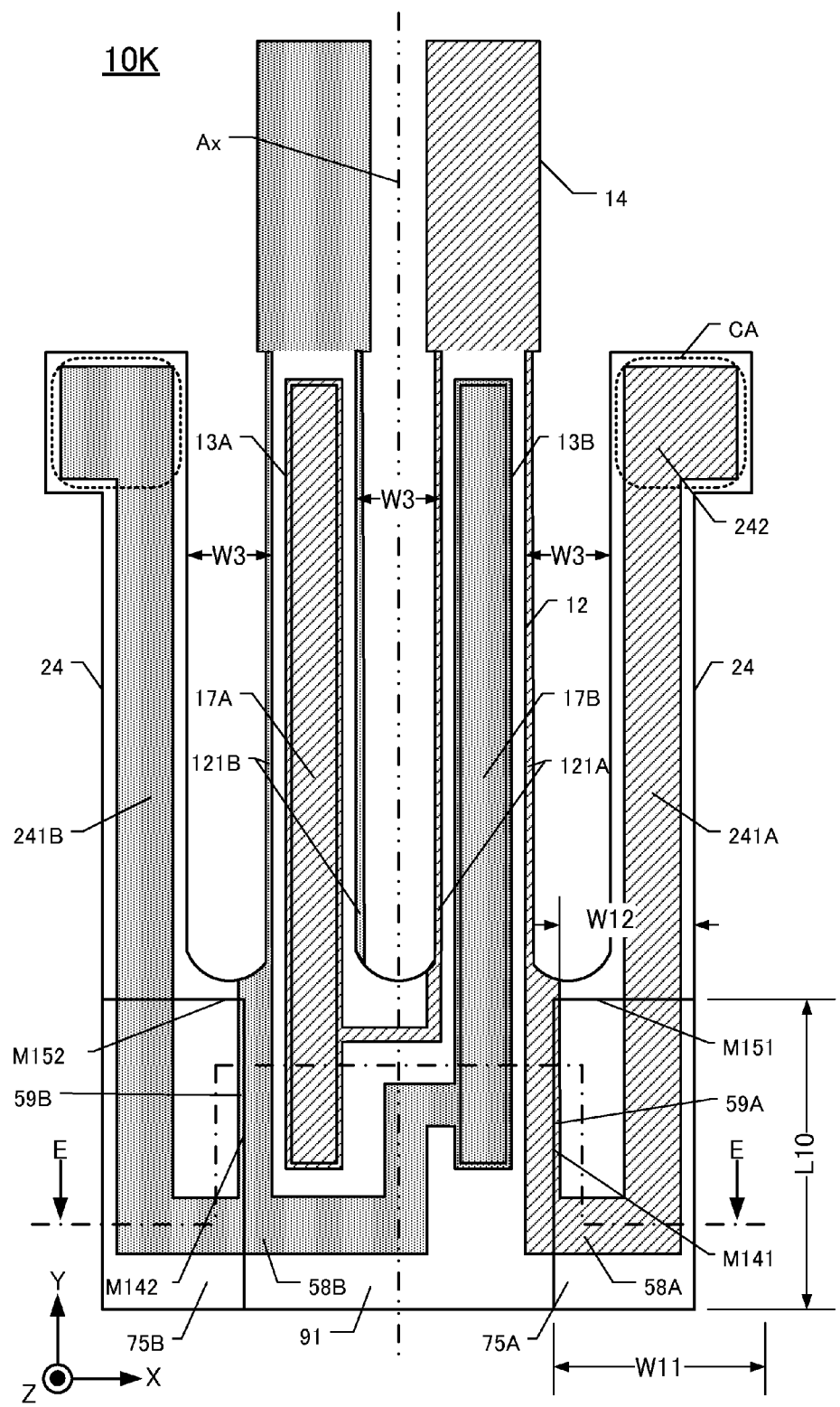
FIG. 14 is a plan view of a 10th embodiment of a tuning-fork type piezoelectric vibrating piece.
Figure 15:
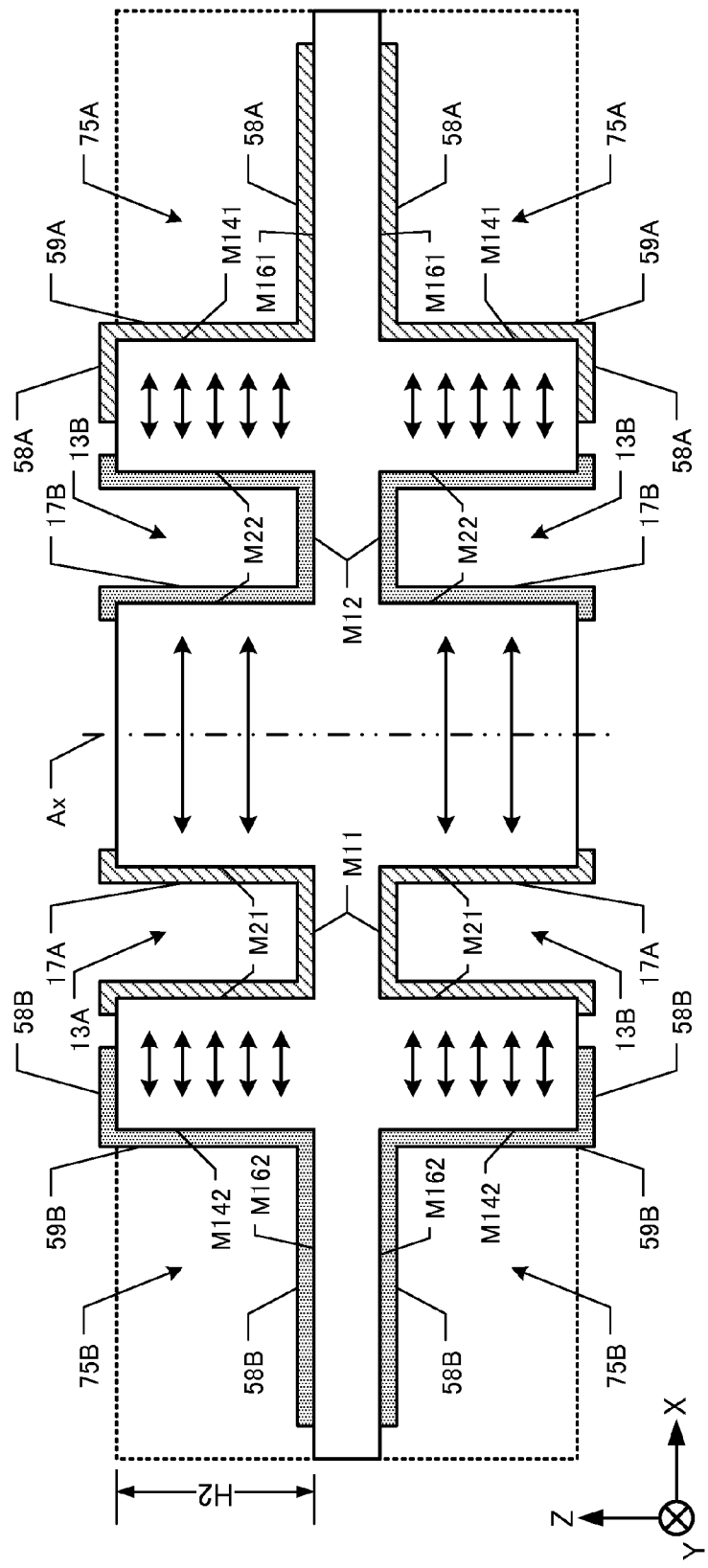
FIG. 15 is a cross-sectional view along the line E-E of FIG. 14.

This embodiment of a piezoelectric vibrating piece 10K is described below with reference to FIGS. 14 and 15. FIG. 14 is a plan view, and FIG. 15 is a cross-sectional view along the line E-E in FIG. 14. In FIG. 14, components that are similar to corresponding components of the seventh embodiment have the same respective reference numerals.

In FIG. 14, a rectangular notch 75A, 75B is formed on the base 91 outboard (in the X-axis direction) of each respective vibrating-arm groove 13A, 13B. The first notch 75A corresponds to the groove 13A, and the second notch 75B corresponds to the groove 13B. The first notch 75A comprises a bottom surface M161 (see FIG. 15), one side surface M141, and one side surface M151 (side surfaces on the −Y side and +X side are not formed). The second notch 75B comprises a bottom surface M162 (see FIG. 15), one side surface M142 and one side surface M152. (side surfaces on the −Y side and +Y side are not formed). The first and second notches 75A, 75B effectively reduce vibration leakage from the vibrating arms 12 to outside the device.

By way of example, the length L10 (in the Y-axis direction) of each of the first and second notches 75A, 75B is about 200 to 500 μm. The first notch 75A is situated on the +X edge of the piezoelectric vibrating piece 10K, and the second notch 75B is situated on the −X edge of the vibrating piece 10K. Hence, the width W12 (in the X-axis direction) of each notch 75A, 75B is about 100 to 300 μm. As shown in FIG. 15, the thickness H2 (in the Z-axis direction) of each notch 75A, 75B is about 20 to 50 μm. Referring again to FIG. 14, the connecting electrode 58A (used for connecting the side-surface excitation electrode 121A to the extraction electrode 241A on the +X side) extends slightly over the first notch 75A and over (in the X-axis direction) the bottom surface M161 of the first notch 75A (see FIG. 15). Similarly, the connecting electrode 58B (used for connecting the side-surface excitation electrode 121B to the extraction electrode 241B on the −X side) extends slightly over the second notch 75B and over (in the X-axis direction) the bottom surface M162 of the second notch 75B (see FIG. 15). Hence, the notch electrode 59A is formed on the surface M141 of the first notch 75A, and the notch electrode 59B is formed on the surface M142 of the second notch 75B.

As shown in FIG. 15, when a square-wave alternating voltage is applied to the groove excitation electrodes 17A, 17B and to the notch electrodes 59A, 59B, the groove excitation electrode 17A and the notch electrode 59A have the same polarity, and the groove excitation electrode 17B and the notch electrode 59B have the same (but opposite) polarity. Thus, an electric field $E_x$ is generated along the arrow directions between the groove excitation electrode 17A and the notch electrode 59B, and between the groove excitation electrode 17B and the notch electrode 59A. The electric field $E_x$ extends in the X-axis direction in the vibrating arms 12, which is perpendicular to the groove excitation electrodes 17A, 17B and notch electrodes 59A, 59B (formed parallel to each other), which results in a larger electric field. Consequently, even if this embodiment is miniaturized, it still exhibits a low equivalent series resistance and high Q value.

Eleventh Embodiment of Tuning-Fork Type Piezoelectric Vibrating Piece

This embodiment of a piezoelectric vibrating piece 10L is described below with reference to FIG. 16. FIG. 16 is a plan view of the vibrating piece 10L. In FIG. 16, components that are similar to corresponding components of the seventh embodiment have the same respective reference numerals.

The eleventh embodiment 10L has substantially the same configuration as the seventh embodiment. The eleventh embodiment 10L has a pair of supporting arms 34 extending in the +Y-axis direction from the base 101. Each supporting arm 34 projects (in the X-axis direction) from a respective side of the base 101. Each supporting arm 34 corresponds to a respective vibrating arm 12. This embodiment 10L also comprises a rectangular outer frame 20 that surrounds the vibrating piece. The outer frame 20 is connected to the base 101 by the supporting arms 34.

This piezoelectric vibrating device 10L includes a pair of rectangular grooves, namely a first base-groove 85A and a second base-groove 85B. The base-grooves 85A, 85B are situated on the base 101 outboard (in the X-axis direction) of respective vibrating-arm grooves 13A, 13B. The first base-groove 85A comprises one side surface M41, three side surfaces M51, and a bottom surface (not shown), and the second base-groove 85B comprises one side surface M42, three side surfaces M52, and a bottom surface (not shown).

A respective extraction electrode 341A is formed on the upper and lower main surfaces of the supporting arm 34 on the +X side. One end of the extraction electrode 341A extends to the corners (+X side and +Y side) of the outer frame portion 20. The other end is connected to the respective connecting electrode 68A. Similarly, an extraction electrode 341B is formed on the upper and lower main surfaces of the supporting arm 34 on the −X side. One end of the extraction electrode 341B extends to the corners (−X side and −Y side) of the outer frame portion 20. The other end is connected to the respective connecting electrode 68B.

The connecting electrode 68A extends slightly (in the X-axis direction) over the first base-groove 85A and forms a respective base-groove electrode 69A on the side surface M41. Similarly, the connecting electrode 68B extends slightly (in the X-axis direction) over the second base-groove 85B and forms a respective base-groove electrode 69B on the side surface M42.

In this embodiment 10L the extraction electrode 341A is connected to the side-surface excitation electrode 121A and the groove excitation electrode 17A via the connecting electrode 68A. Similarly, the extraction electrode 341B is connected to the side-surface excitation electrode 121B and the groove excitation electrode 17B via the connecting electrode 68B. Whenever the extraction electrodes 341A, 341B are connected to the external electrode 315 (see FIG. 18) via the though-hole electrode 314B (see FIG. 18), the external electrode and the excitation electrodes are energized to cause vibration of the vibrating arms 12.

The components of the electric field produced by this eleventh embodiment 10L are similar to respective components of electric field produced by the seventh embodiment (FIG. 10).

In the eleventh embodiment (including the outer frame portion 20), the base-grooves 85A, 85B are formed on the base 101. Alternatively, they can be replaced with through-holes as described in the eighth embodiment or with notches as described in the ninth and tenth embodiments.

First Embodiment of Piezoelectric Vibrating Device

A first embodiment of a piezoelectric vibrating device 100, comprising the first embodiment of a tuning-fork type piezoelectric vibrating piece 10A, is shown in FIG. 17A. FIG. 17A is an elevational section of the device 100.

The piezoelectric vibrating device 100 includes a package PK having a cavity CT defined by a package base 111, a wall 112, and a lid 113. The package PK accommodates the piezoelectric vibrating piece 10A within the cavity CT. The package base 111 and wall 112 are made of, for example, a piezoelectric crystal, ceramic, or glass material. The lid 113 can be made of a piezoelectric crystal, a metal (e.g., Fe—Ni—Co alloy), or a glass. The cavity CT contains an inert gas or is evacuated before being hermetically sealed by, e.g., seam bonding.

The package base 111 includes a mount 114 formed on the −Y side thereof. The mount 114 contacts the package base 111 and the wall 112. The mount 114 is formed of a piezoelectric crystal, ceramic, or glass material (similar to the package base 111 and wall 112). The base 11 of the piezoelectric vibrating piece 10A is affixed to the mount 114 using electrically conductive adhesive 115.

A base electrode 16A (see FIG. 1), formed on the base 11, is connected to the external electrode 117 using electrically conductive adhesive 115 and the connecting electrode 116. The connecting electrode 118 is connected to the external electrode 119 provided on the lower main surface of the package base 111. The connection passes between the package base 111 and the wall 112. Whenever a square-wave alternating voltage is applied to the external electrodes 117, 119, the vibrating arms 12 are excited to vibrate.

It will be understood that, in alternative embodiments of the device 100, the piezoelectric vibrating piece 10A can be replaced with any of the piezoelectric vibrating pieces according to the second through sixth embodiments.

Second Embodiment of Piezoelectric Vibrating Device

This embodiment of a piezoelectric vibrating device 200 comprises a tuning-fork type piezoelectric vibrating piece 10G as described in the seventh embodiment, and is shown in FIG. 17B. FIG. 17B is an elevational section of this embodiment.

As shown in FIG. 17B, the piezoelectric vibrating device 200 includes a package PK having a cavity CT comprising a package base 211, a wall 212, and a lid 213. The package PK accommodates the seventh embodiment of a tuning-fork type piezoelectric vibrating piece 10G within the cavity CT. The package base 211 includes a mount 214 formed on the midline (in the Y-axis direction) of the package base 211. The mount 214 can be formed of a piezoelectric crystal, ceramic, or glass material like the package base 211 or the wall 212. The wider arm portions 242 of the supporting arms 24 are affixed to the mount 214 using electrically conductive adhesive 215. The extraction electrode 241A, formed on the supporting arm 24 (see FIG. 9), is connected to the external electrode 217 via the electrically conductive adhesive 215 and the connecting electrode 216.

This embodiment was described with the piezoelectric vibrating device 200 including the seventh embodiment of a tuning-fork type piezoelectric vibrating piece 10G, Alternatively, a tuning-fork type piezoelectric vibrating piece as described in any of the eighth through tenth embodiments can be used.

Third Embodiment of Piezoelectric Vibrating Device

Figure 18A:
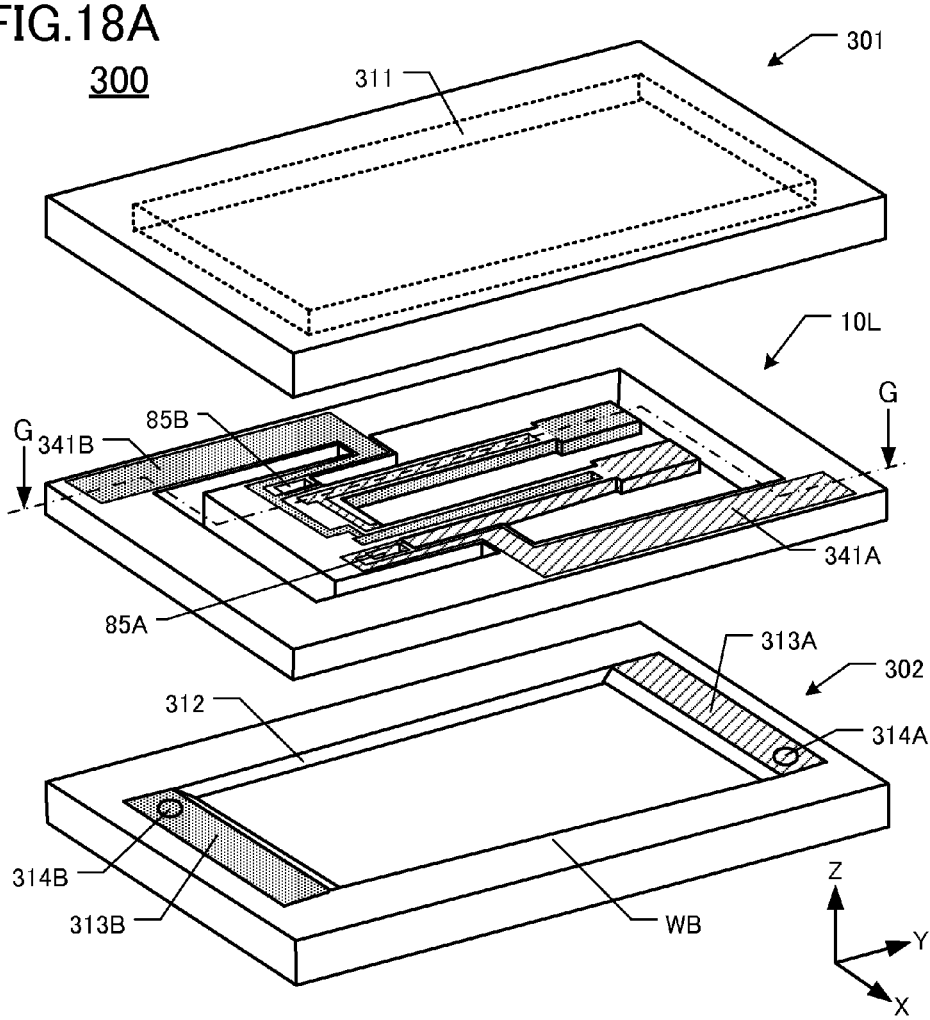
FIG. 18A is an exploded perspective view of a piezoelectric vibrating device comprising the eleventh embodiment of a tuning-fork type piezoelectric vibrating piece.
Figure 18B:
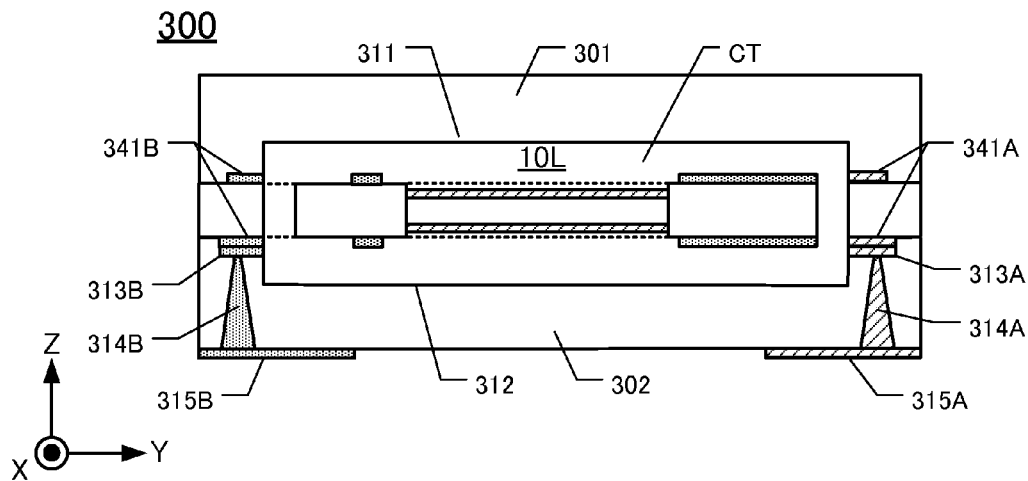
FIG. 18B is a cross-sectional view along the line G-G of FIG. 18A.

This embodiment of a piezoelectric vibrating device 300 comprises a tuning-fork type piezoelectric vibrating piece 10L according to the eleventh embodiment and is shown in FIGS. 18A and 18B. FIG. 18A is an exploded perspective view of the vibrating device 300. FIG. 18B is a cross-sectional view along the line G-G in FIG. 18B.

In FIG. 18A, the piezoelectric vibrating device 300 comprises a lid 301, a package base 302, and the tuning-fork type piezoelectric vibrating piece 10L sandwiched between the lid and base. The lid 301, package base 302, and vibrating piece 10L are each made of a piezoelectric material. The lid 301 has a lid concavity 311, formed by etching, on its inner main surface that faces the vibrating piece 10L. The package base 302 has a base concavity 312, formed by etching, which faces the vibrating piece 10L. Thus, the lid concavity 311 and base concavity 312 form a cavity CT.

Base-connecting electrodes 313A, 313B are situated on both sides, in the Y-axis direction, on a +Z surface of the package base 302. A through-hole electrode 314A is situated under the base-connecting electrode 313A, and a through-hole electrode 314B is situated under the base-connecting electrode 313B. Further, as shown in FIG. 18B, the through-hole electrode 314A is connected to the external electrode 315A, and the through-hole electrode 314B is connected to the external electrode 315B.

In FIG. 18B, the tuning-fork type piezoelectric vibrating piece 10L is located in the center of cavity CT. The package base 302 is bonded to the lower main surface of the vibrating piece 10L, and the lid 301 is bonded to the upper main surface of the piece. Both these bonds are made by siloxane bonding (Si—O—Si) or by anodic bonding.

According to this configuration, the extraction electrode 341A connects to the external electrode 315A via the base-connecting electrode 313A and the through-hole electrode 314A, and the extraction electrode 341B connects to the external electrode 315B via the base-connecting electrode 313B and the through-hole electrode 314B.

Regarding the first through eleventh embodiments of the tuning-fork type piezoelectric vibrating piece, an alternative piezoelectric material is lithium niobate.

Regarding the first through third embodiments of the piezoelectric vibrating devices, the lid, package base, and walls can be made of any of various materials, such as (but not limited to) glass or crystal material. Crystal material is preferred for the following reasons: One of the indicators of hardness of an industrial material is the "Knoop hardness." A higher Knoop hardness number indicates greater hardness, and a lower number indicates greater softness. The Knoop hardness number of borosilicate glass (commonly used for making lids and package bases) is 590 kg/mm2, and the Knoop hardness number of quartz crystal is 710 to 790 kg/mm2. Thus, making the lids, package bases, and walls of crystal instead of glass produces piezoelectric devices having a higher degree of hardness. But, when fabricated of crystal, these components can be made with a thinner profile while achieving the same strength and hardness. I.e., in fabricating piezoelectric devices in which the lids and package bases are made of crystal instead of glass, devices having the same strength and hardness as obtained when they are made of glass can be made that are more miniaturized and thinner than if they were made of glass.

Whenever a piezoelectric device is manufactured or mounted to a printed circuit board, heat is normally applied to the piezoelectric device. When, in the third embodiment of a piezoelectric vibrating device, a crystal material is used for making the piezoelectric vibrating piece 10L and a non-crystalline material is used for making the lid 301 and package base 302, the interior of the device may become stressed due to differences in the respective thermal expansion coefficients of the crystal vibrating piece versus of the lid and package base. Greater stress can cause fracture of the corners of the outer frame portion WB of the piezoelectric vibrating piece 10L, which tend to have lower stress intensity than other regions. Thus, it is desirable to narrow the differences in respective thermal expansion coefficients of the lid 301 and package base 302 relative to the thermal expansion coefficient of the vibrating piece 10L. It is desirable that a crystal material be used for making the lid 301 and package base 302 because crystal material reduces the differences in thermal expansion coefficients and can reduce stresses in the interior of the piezoelectric vibrating device, compared to devices having lids and package bases made of glass. Also, using a crystal material facilitates miniaturization or the making of a thinner profile of the piezoelectric device.

While example embodiments have been described of the present invention, it will be understood by those of skill in the art that various changes in form and details may be made therein without departing from the spirit and scope of the following claims. The present invention also can be applied to, alternatively to a piezoelectric vibrating device, a piezoelectric oscillator including an integrated circuit IC on its package base. The IC incorporates an oscillation circuit.

What is claimed is:

1. A piezoelectric vibrating piece comprising:
a base having a substantially rectangular shape, an upper main surface and a lower main surface;

a pair of vibrating arms having the upper and lower main surfaces and extending in a Y-axis direction from the base, the pair including first and second vibrating arms;

a respective vibrating-arm groove on each main surface of each vibrating arm, each vibrating-arm groove extending in the Y-axis direction onto the base;

at least one respective step-side surface situated on each main surface of the base outboard, in an X-axis direction, of each vibrating-arm groove, each step-side surface being parallel with the respective vibrating-arm groove;

a first electrode situated on the vibrating-arm grooves of the first vibrating arm and on the at least one respective step-side surface on each main surface; and a second electrode situated on the vibrating-arm grooves of the second vibrating arm and on the at least one respective step-side surface on each main surface;

wherein the first and second electrodes are energized with different electrical polarities; the step-side surfaces are defined by respective side surfaces of respective through-holes extending depthwise, in a Z-axis direction, through the base from the upper main surface to the lower main surface; and each at least one side-step surface comprises at least one side surface of the respective notch.

2. The piezoelectric vibrating piece of claim 1, wherein:
the base and vibrating arms collectively have a plan profile; and
the through-holes are formed simultaneously with formation of the plan profile.

3. The piezoelectric vibrating piece according to claim 1, wherein:
the step-side surfaces are defined by respective side surfaces of respective base-grooves defined in the upper and lower main surfaces; and
each at least one step-side surface comprises at least one side surface of the respective base-groove.

4. The piezoelectric vibrating piece of claim 3, wherein the base-grooves are formed simultaneously with formation of the vibrating-arm grooves.

5. The piezoelectric vibrating piece according to claim 1, wherein:
the step-side surfaces are defined by respective side surfaces of respective notches defined in a −X-side edge and in a +X-side edge of the base; and
each at least one step-side surface comprises at least one side surface of the respective notch.

6. The piezoelectric vibrating piece of claim 5, wherein the notches are formed simultaneously with formation of vibrating-arm grooves.

7. A piezoelectric device, comprising:
a surface-mountable package defining a cavity; and
a piezoelectric vibrating piece as recited in claim 1 situated in the cavity.

8. A piezoelectric vibrating piece, comprising:
a base having a substantially rectangular shape, an upper main surface, and a lower main surface;
a pair of vibrating arms having the upper and lower main surfaces and extending in a Y-axis direction from the base, the pair including first and second vibrating arms;
a respective vibrating-arm groove on each main surface of each vibrating arm, each vibrating-arm groove extending in the Y-axis direction onto the base;
a respective supporting arm situated outboard, in an X-axis direction, of each vibrating arm and connected to the base, each supporting arm extending in the Y-axis direction;

at least one respective step-side surface situated on each main surface of the base outboard, in an X-axis direction, of each vibrating-arm groove but inboard, in the X-axis direction, of the respective supporting arm, each step-side surface being parallel with the respective vibrating-arm groove;

a first electrode situated on the vibrating-arm grooves of the first vibrating arm and on the at least one respective step-side surface on each main surface;

a second electrode situated on the vibrating-arm grooves of the second vibrating arm and on the at least one respective step-side surface on each main surface; and a frame portion surrounding the base and vibrating arms, wherein the supporting arms are connected to the frame portion and support the base and vibrating arms; wherein the first and second electrodes are energized with different electrical polarities; the step-side surfaces are defined by respective side surfaces of respective through-holes extending depthwise in a Z-axis direction, through the base from the upper main surface to the lower main surface; and each at least one step-side surface comprises at least one side surface of the respective through-hole.

9. The piezoelectric vibrating piece according to claim 8, wherein:
the step-side surfaces are defined by respective side surfaces of respective base-grooves defined in the upper and lower main surfaces; and
each at least one step-side surface comprises at least one side surface of the respective base-groove.

10. The piezoelectric vibrating piece according to claim 8, wherein:
the step-side surfaces are defined by respective side surfaces of respective notches defined in a −X-side edge and in a +X-side edge of the base; and
each at least one step-side surface comprises at least one side surface of the respective notch.

11. A piezoelectric device, comprising:
a lid;
a package base; and
a piezoelectric vibrating piece as recited in claim 8, wherein the frame portion is sandwiched between the lid and the package base.

12. The piezoelectric vibrating piece according to claim 8, wherein:
the step-side surfaces are defined by respective side surfaces of respective through-holes extending depthwise, in a Z-axis direction, through the base from the upper main surface to the lower main surface; and
each at least one step-side surface comprises at least one side surface of the respective through-hole.

13. The piezoelectric vibrating piece of claim 12, wherein:
the base and vibrating arms collectively have a plan profile; and
the through-holes are formed simultaneously with formation of the plan profile.

14. The piezoelectric vibrating piece according to claim 8, wherein:
the step-side surfaces are defined by respective side surfaces of respective base-grooves defined in the upper and lower main surfaces; and
each at least one step-side surface comprises at least one side surface of the respective base-groove.

15. The piezoelectric vibrating piece of claim 14, wherein the base-grooves are formed simultaneously with formation of the vibrating-arm grooves.

16. The piezoelectric vibrating piece according to claim 8, wherein:
the step-side surfaces are defined by respective side surfaces of respective notches defined in a −X-side edge and in a +X-side edge of the base; and
each at least one step-side surface comprises at least one side surface of the respective notch.

17. The piezoelectric vibrating piece of claim 16, wherein the notches are formed simultaneously with formation of vibrating-arm grooves.

18. A piezoelectric device, comprising:
a surface-mountable package defining a cavity; and
a piezoelectric vibrating piece as recited in claim 8 situated in the cavity.

19. A piezoelectric vibrating piece comprising:
a base having a substantially rectangular shape, an upper main surface and a lower main surface;
a pair of vibrating arms having the upper and lower main surfaces and extending in a Y-axis direction from the base, the pair including first and second vibrating arms;
a respective vibrating-arm groove on each main surface of each vibrating arm, each vibrating-arm groove extending in the Y-axis direction onto the base;
at least one respective step-side surface situated on each main surface of the base outboard, in an X-axis direction, of each vibrating-arm groove, each step-side surface being parallel with the respective vibrating-arm groove;
a first electrode situated on the vibrating-arm grooves of the first vibrating arm and on the at least one respective step-side surface on each main surface; and
a second electrode situated on the vibrating-arm grooves of the second vibrating arm and on the at least one respective step-side surface on each main surface;
wherein the first and second electrodes are energized with different electrical polarities, and wherein the vibrating-arm groove on each main surface of the base and the step-side surfaces situated on each main surface of the base extend to the same position in the Y-axis direction.

\* \* \* \* \*